(12) United States Patent
Lin et al.

(10) Patent No.: US 9,501,589 B2
(45) Date of Patent: Nov. 22, 2016

(54) IDENTIFICATION OF POWER SENSITIVE SCAN CELLS

(71) Applicant: Mentor Graphics Corporation, Wilsonville, OR (US)

(72) Inventors: Xijiang Lin, West Linn, OR (US); Yu Huang, Sudbury, MA (US); Wu-Tung Cheng, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/517,609

(22) Filed: Oct. 17, 2014

(65) Prior Publication Data

US 2015/0040087 A1   Feb. 5, 2015

Related U.S. Application Data

(63) Continuation-in-part of application No. 12/991,688, filed as application No. PCT/US2009/043214 on May 7, 2009, now Pat. No. 8,890,563.

(60) Provisional application No. 61/051,317, filed on May 7, 2008, provisional application No. 61/051,321, filed on May 7, 2008.

(51) Int. Cl.
*G06F 17/50* (2006.01)
*G01R 31/3185* (2006.01)

(52) U.S. Cl.
CPC ... *G06F 17/5022* (2013.01); *G01R 31/318575* (2013.01)

(58) Field of Classification Search
CPC ............. G06F 17/5022; G06F 17/5009; G01R 31/318575; G01R 31/318533
USPC .......................................................... 326/16
See application file for complete search history.

(56) References Cited

U.S. PATENT DOCUMENTS

| | | | | |
|---|---|---|---|---|
| 8,700,962 | B2* | 4/2014 | Tekumalla | G01R 31/318536 714/726 |
| 8,890,563 | B2* | 11/2014 | Lin | G01R 31/318575 324/73.1 |
| 8,914,691 | B2* | 12/2014 | Socarras | 714/726 |
| 8,935,582 | B2* | 1/2015 | Guo | G01R 31/3177 714/25 |
| 2007/0250749 | A1* | 10/2007 | Lin | G01R 31/31721 714/738 |

(Continued)

OTHER PUBLICATIONS

M. ElShoukry, C. Ravikumar, and M. Tehranipoor, "Partial Gating Optimization for Power Reduction During Test Application," Proc. of 14th ATS, pp. 242-247, 2005.

(Continued)

*Primary Examiner* — Dylan White

(57) ABSTRACT

Aspects of the disclosed techniques relate to techniques for identifying power sensitive scan cells. Signal probability values for signal lines in a circuit design are first computed, wherein the signal lines comprise signal lines associated with scan cells in the circuit design. Toggling probability values are then computed based on the signal probability values, wherein the toggling probability values comprise toggling rate values for the scan cells. Toggling rate reduction values are then computed based on the toggling probability values, wherein the toggling rate reduction values comprise toggling rate reduction values for the scan cells. Finally, scan cells having high toggling rate reduction values are identified.

8 Claims, 16 Drawing Sheets

(56) References Cited

U.S. PATENT DOCUMENTS

| | | | | |
|---|---|---|---|---|
| 2009/0319842 A1* | 12/2009 | Wen | ................. | G01R 31/31721 |
| | | | | 714/738 |
| 2010/0095177 A1* | 4/2010 | Forlenza | ........ | G01R 31/318547 |
| | | | | 714/731 |
| 2011/0197171 A1* | 8/2011 | Wang | ............... | G01R 31/31704 |
| | | | | 716/107 |
| 2015/0040087 A1* | 2/2015 | Lin | .................... | G06F 17/5022 |
| | | | | 716/109 |
| 2015/0148515 A1* | 5/2015 | Kim | ...................... | C08G 63/83 |
| | | | | 528/281 |

OTHER PUBLICATIONS

A. Hertwig and H.-J. Wunderlich, "Low Power Serial Built-In Self-Test", Proc. of European Test Workshop, pp. 49-53, 1998.

S. Gerstendorfer and H.-J. Wunderlich, "Minimized Power Consumption for Scan-Based BIST", Proc. of Int'l Test Conference 1999, pp. 77-84.

R. Sankaralingam and N.A. Touba, "Inserting Test Points to Control Peak Power During Scan Testing", Proc. of the 17th IEEE Int'l Symp. on Defect and Fault Tolerance in VLSI Systems (DFT'02).

* cited by examiner

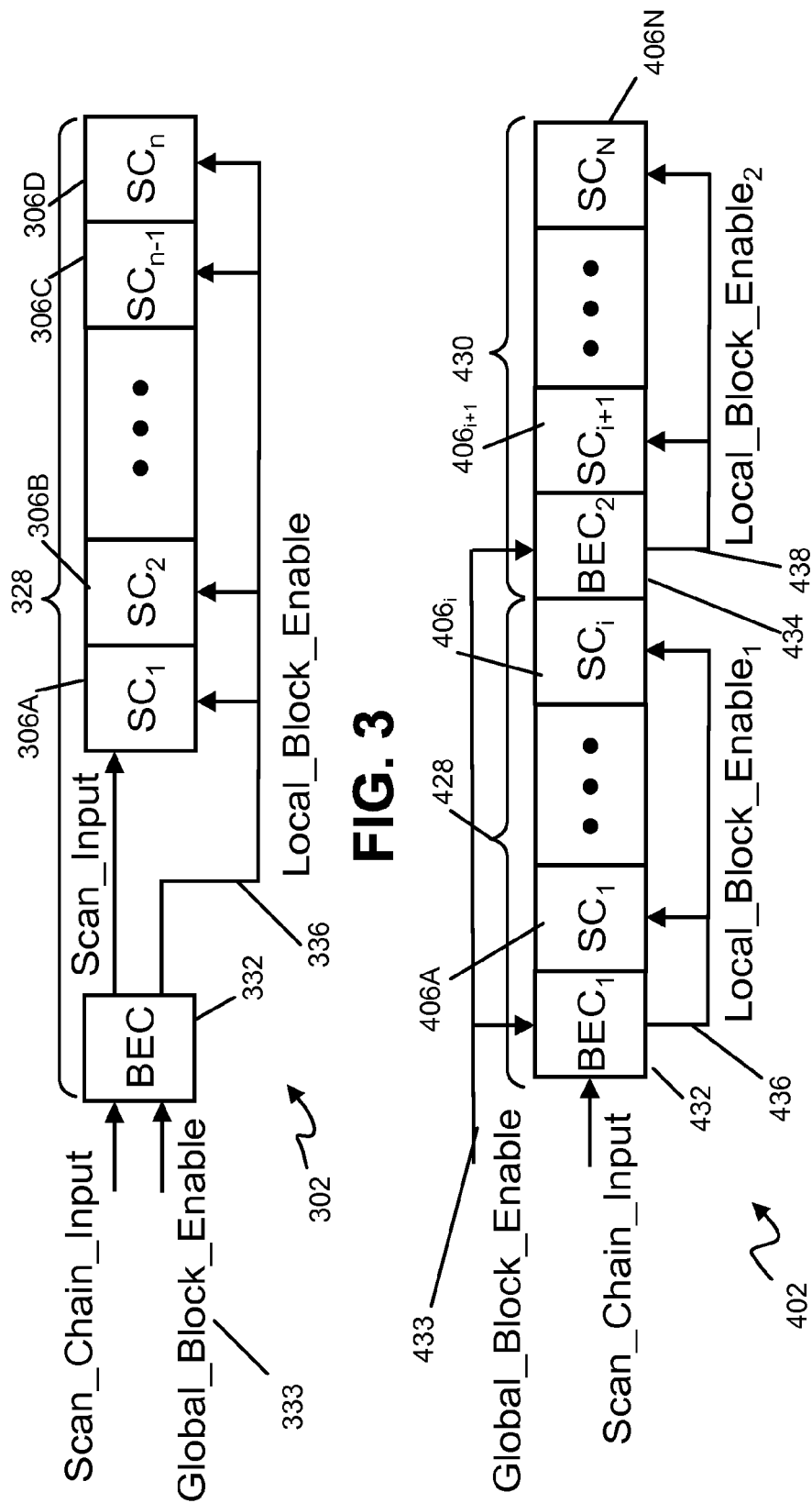

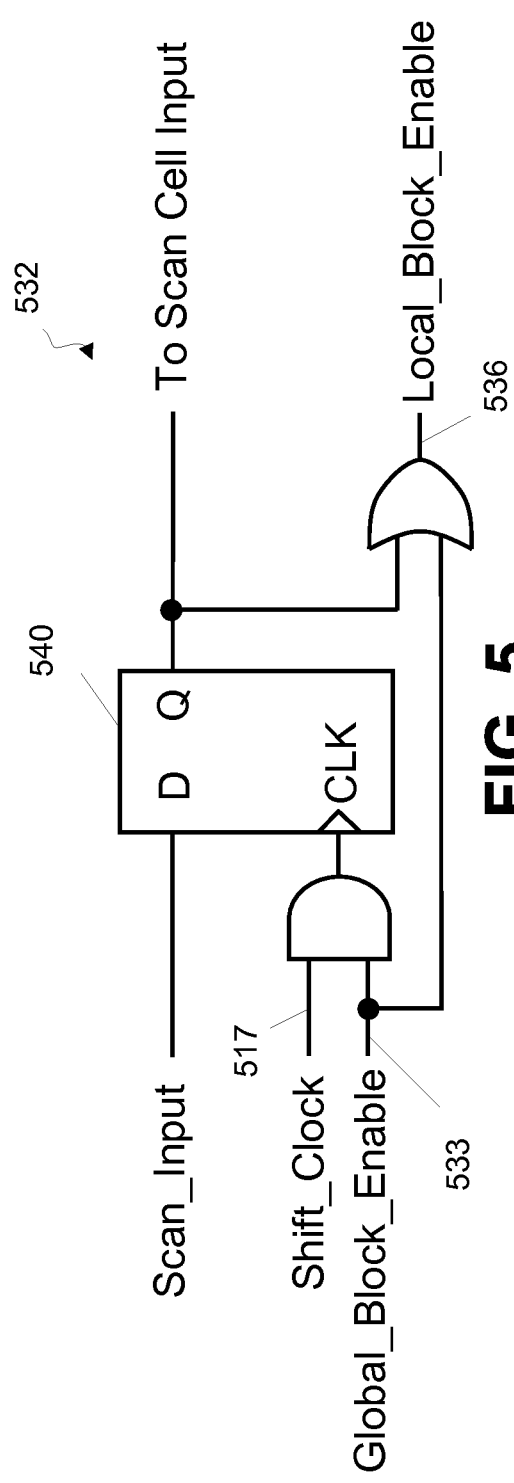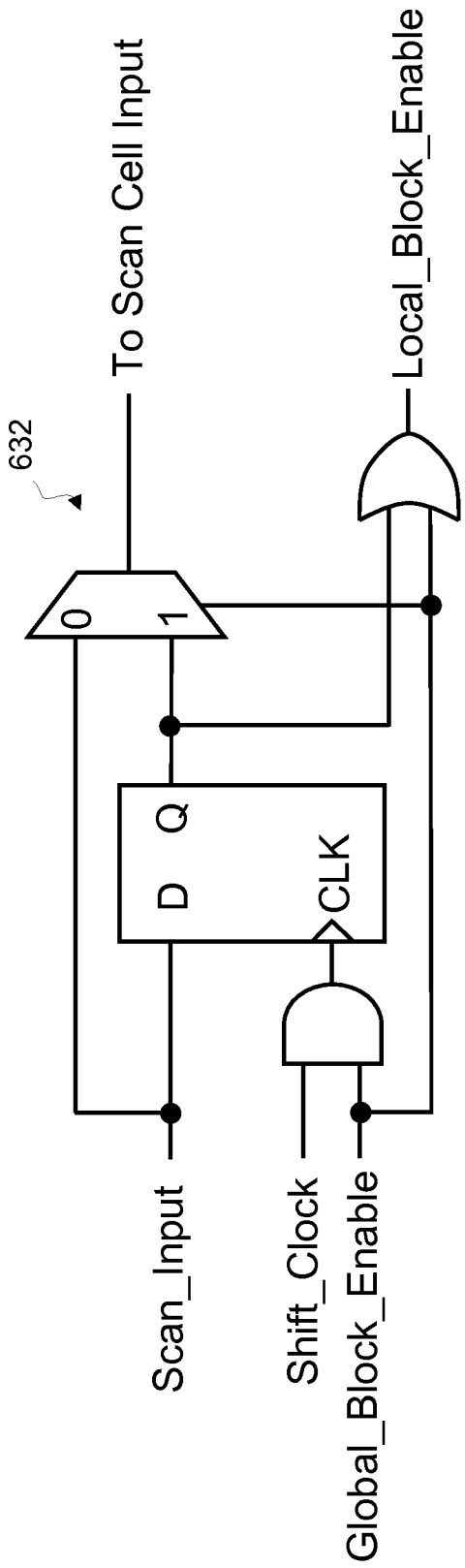

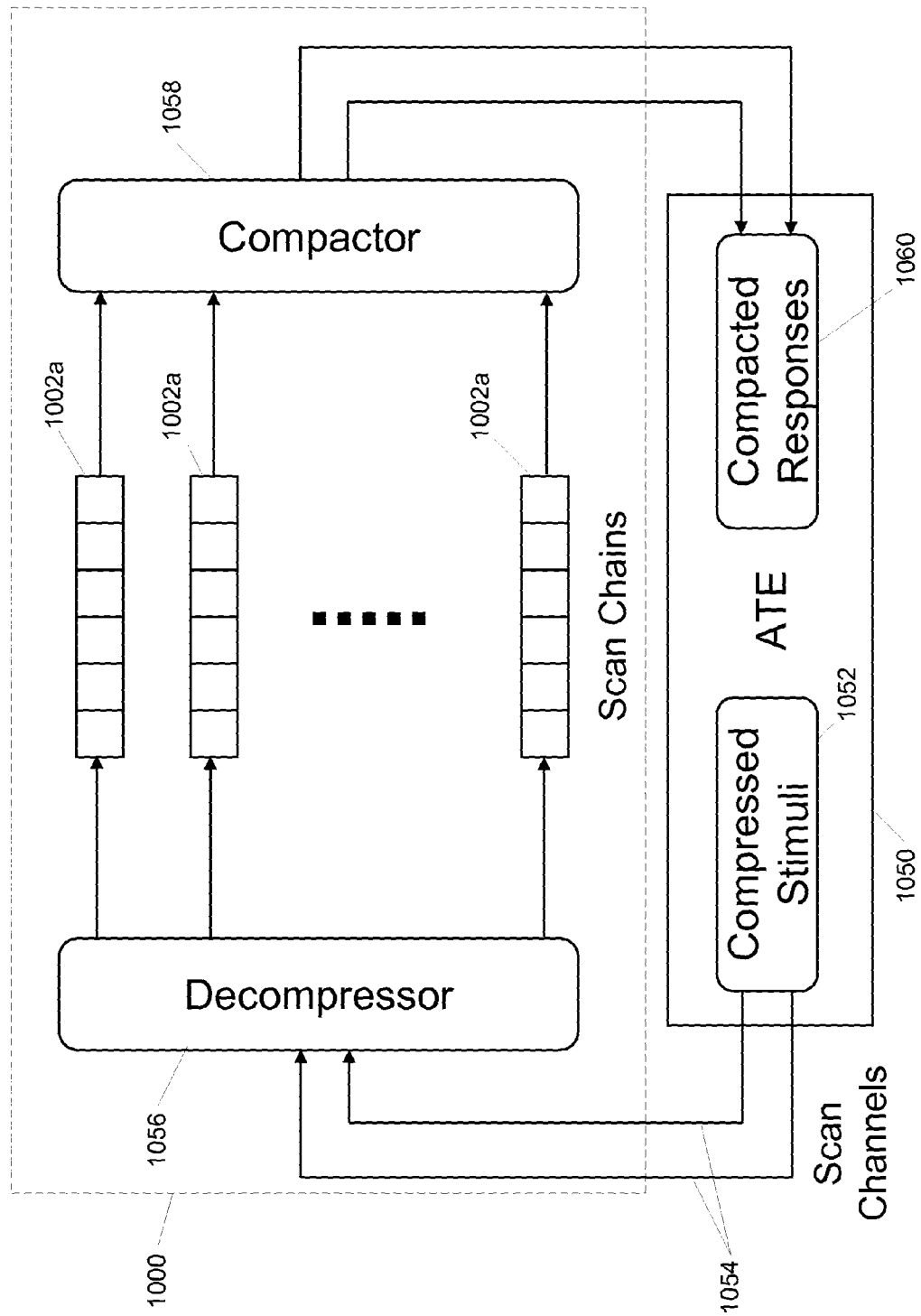

IDENTIFICATION OF POWER SENSITIVE SCAN CELLS

RELATED APPLICATIONS

This application is a continuation-in-part application of U.S. application Ser. No. 12/991,688, filed on Jun. 30, 2011, which is a national stage application of International Application No. PCT/US2009/043214, filed on May 7, 2009, which claims benefit of U.S. Provisional Patent Application No. 61/051,317 filed on May 7, 2008 and U.S. Provisional Patent Application No. 61/051,321 filed on May 7, 2008. These previously filed applications are incorporated entirely herein by reference.

FIELD OF THE INVENTION

The present invention is directed to reducing power consumption in a circuit device during scan testing. Various implementations of the invention may be useful for reducing power consumption by preventing scan cell transitions from reaching functional logic under test.

BACKGROUND OF THE INVENTION

Since their commercial introduction a half century ago, many types of integrated circuit (IC) devices have been developed, and they now are widely used in consumer electronics, military, medical, and industrial applications. During portions of the manufacturing process of an integrated circuit device, as well as afterwards, it often desirable to test the device to verify that it works properly.

Design-for-test ("DFT") techniques employing scan circuits and automatic test pattern generation ("ATPG") are commonly used as part of integrated circuit manufacturing to provide high test coverage as well as to reduce test cost. In scan-based testing, memory elements embedded in integrated circuit devices (sometimes referred to as "scan cells") are arranged in series to form one or more scan chains. The scan chains are connected to functional logic within the integrated circuit device so that the scan chains can apply signals values to the functional logic, and so that signal values produced by the functional logic can be stored in the scan cells of the scan chain.

A test pattern generated for scan-based design typically is applied as follows. The tester loads the test values of the test pattern into the scan chain through a scan shifting operation. During the scan shifting operation, the test values are sequentially passed from scan cell to scan cell, until the test values are located in their designated scan cells along the scan chain. The shifting operation is followed by one or more clock cycles, called capture cycles, during which test values are applied to the function logic, and the values produced by the functional logic in response are captured by the scan cells. Finally, the test responses are sequentially unloaded from the scan chain through another scan shifting operation for subsequent analysis. Typically, the test values are loaded from an automatic test pattern generation (ATPG) tool, and the test responses are output to the ATPG tool.

The scan tests generated by a typical ATPG tool, however, can create switching activity on the integrated circuit that far exceeds the activity present during normal operation of the circuit. Excessive switching activity can be created when a scan test causes the device-under-test to operate outside of its normal functional operation. Furthermore, excessive switching activity can occur during several stages of the testing operation. For example, excessive switching can occur when the scan chain is loading a test pattern, unloading a test response, or when its scan cell contents are updated during the capture cycles. The excess power consumption raises the device temperature, sometimes high enough to damage the device. High switching activity also causes voltage droops on signal lines that result in slower performance of the chip, and misidentification of a good device as defective.

BRIEF SUMMARY OF THE INVENTION

Aspects of the disclosed techniques relate to techniques for identifying power sensitive scan cells. In one aspect, there is a method comprising: computing signal probability values for signal lines in a circuit design, wherein the signal lines comprise signal lines associated with scan cells in the circuit design; computing toggling probability values based on the signal probability values, wherein the toggling probability values comprise toggling rate values for the scan cells; computing toggling rate reduction values based on the toggling probability values, wherein the toggling rate reduction values comprise toggling rate reduction values for the scan cells; and identifying scan cells having high toggling rate reduction values.

The method may further comprise inserting logic configured to freeze parallel outputs of the identified scan cells during a scan shift process into the design.

The signal lines may comprise signal lines associated with primary inputs of the circuit design.

The computing signal probability values may comprise: computing signal probability values when the signal probability values at parallel outputs of the scan cells are (0.5, 0.5); computing signal probability values when the signal probability values at parallel output of one scan cell are (1, 0) and the signal probability values at parallel outputs of the other scan cells are (0.5, 0.5); and computing signal probability values when the signal probability values at parallel output of the one scan cell are (0,1) and the signal probability values at parallel outputs of the other scan cells are (0.5, 0.5).

The identifying may be based on a predetermined percentage value.

In another aspect, there is a non-transitory computer readable medium storing computer-executable instructions for causing one or more processors to perform a method, the method comprises: computing signal probability values for signal lines in a circuit design, wherein the signal lines comprise signal lines associated with scan cells in the circuit design; computing toggling probability values based on the signal probability values, wherein the toggling probability values comprise toggling rate values for the scan cells; computing toggling rate reduction values based on the toggling probability values, wherein the toggling rate reduction values comprise toggling rate reduction values for the scan cells; and identifying scan cells having high toggling rate reduction values.

BRIEF DESCRIPTION OF THE DRAWINGS

FIG. 3 shows a scan chain that contains a single scan segment and a block enable cell (BEC);

FIG. 4 shows a scan chain that has two scan segments and two block enable cells;

FIG. 5 shows an implementation of a block enable cell;

FIG. 6 shows another implementation of a block enable cell;

FIG. 10 shows automated test equipment that provides compressed stimuli through one or more scan channels to a decompressor incorporated in an IC device;

DETAILED DESCRIPTION OF THE INVENTION

Scan-Based Testing of Integrated Circuits

In an integrated circuit (IC) device, the internal circuitry of the device is not directly accessible for testing by external test equipment. In scan-based testing of an integrated circuit device, special components called scan cells are incorporated into the integrated circuit design to provide a way to improve controllability and observability of internal signal data during testing. Using the internal signal data recorded by the scan cell, a tester can detect defects in the device introduced during manufacturing. The scan cells receive test data, either from external test equipment, or decompressed from compressed external test data, apply the test data as input to the functional logic of the integrated circuit, and capture the response of the functional logic to the applied test data. Typically, the captured test data is provided to external test equipment for storage and subsequent analysis.

Figure 1A:
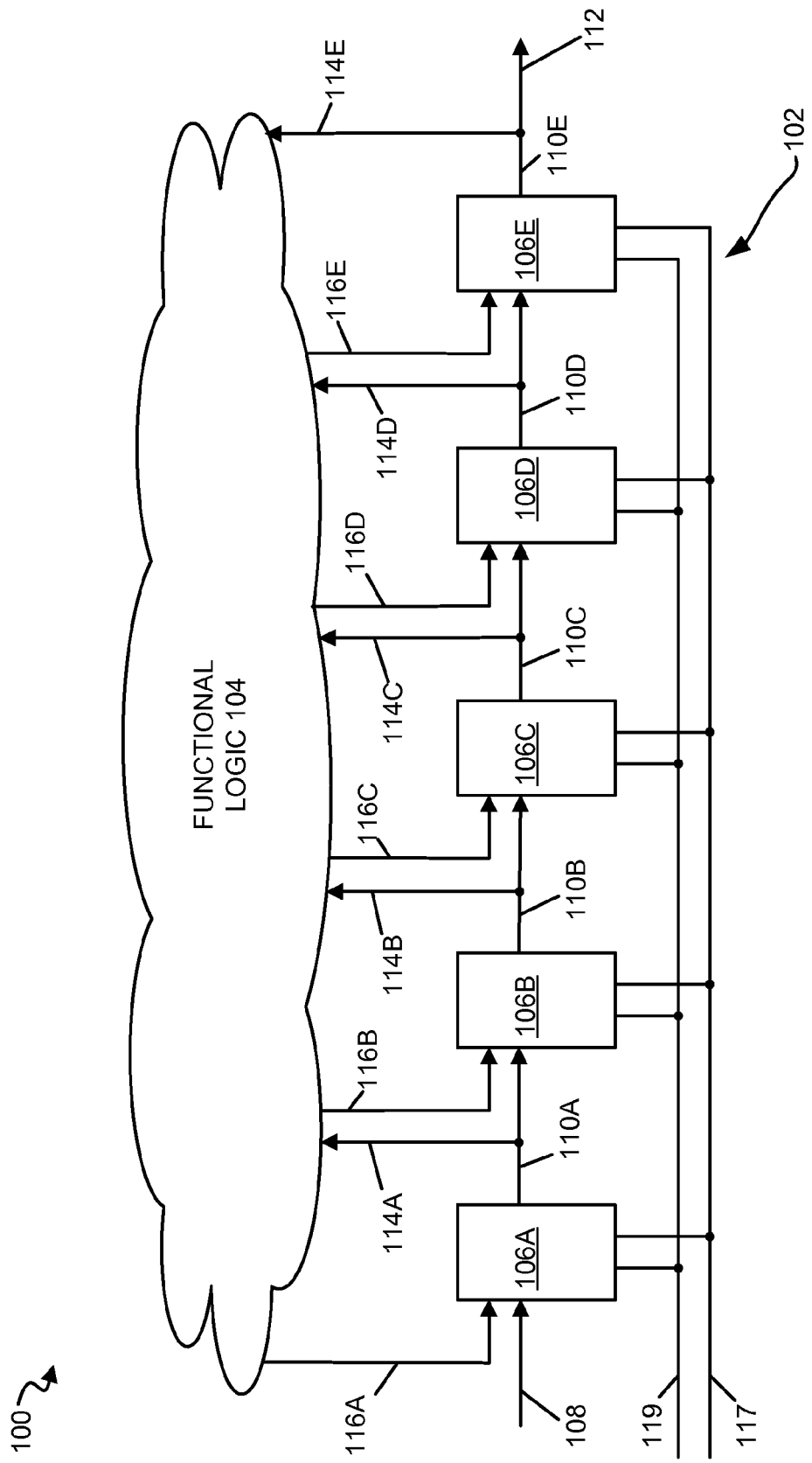
FIG. 1A illustrates a portion of an integrated circuit device that includes a conventional scan chain coupled to functional logic.

FIG. 1A illustrates a portion of an integrated circuit device 100 that includes a conventional scan chain 102 coupled to functional logic 104. The scan chain 102 can include any number of scan cells 106. Only five scan cells, 106A, 106B, 106C, 106D, and 106E, are shown in the figure for ease of explanation. It should be noted, however, that in contrast to the scan chain 102, a typical scan chain used in many conventional integrated circuit devices may include hundreds of scan cells 106, employing the basic operations explained with reference to the scan chain 102. It should be appreciated that the various implementations of the invention described herein may be employed with scan chains having any number of scan cells. Further, it should be noted that, while various implementations of test power reduction techniques will be described herein in the context of one scan chain, these implementations also can be applied to an integrated circuit device having multiple scan chains.

During each clock cycle of operation of the scan chain 102, the first scan cell 106A receives a test pattern value input from an external pin 108 of the integrated circuit device 100. In the subsequent clock cycle, the scan cell 106A provides that test pattern as output 110A to its immediate successor scan cell 106B in the scan chain 102. Similarly, scan cell 106B provides its output 110B to scan cell 106C, scan cell 106C provides its output 110C to scan cell 106D, and scan cell 106D provides its output 110D to its immediate successor scan cell 106E. The final scan cell 106E will then present its output 110E to an external output pin 112 of the integrated circuit device 100. Signal lines 114A-114E also deliver the scan cell output values to various components of the functional logic 104, while signal lines 116A-116E present signals from the functional logic 104 as inputs to the scan cells 106A-106E of the scan chain 102. In this manner, signal values can be sequentially shifted from the external input pin 108, through each scan cell 106, to the external output pin 112.

Figure 2:
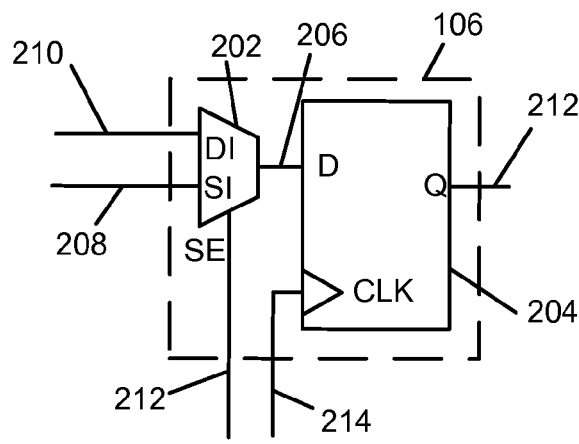
FIG. 2 shows a scan cell that includes two primary components, a multiplexer and a memory element.

As shown in the FIG. 2, a conventional scan cell 106 typically includes two primary components. One component is a multiplexer 202 or other type of switching circuit, while the other component is some type of memory element 204, such as the D-type flip-flop shown in this figure. The two components are connected by a signal line 206, so that the output of the multiplexer 202 is provided as input to the memory element 204. It should be understood that a scan cell can be implemented in a variety different ways, however, and that the particular scan cell configuration shown in FIG. 2 is but one of the possible implementations that may be employed by various embodiments of the invention.

A test value signal line 208 provides one input to the multiplexer 118. Depending upon the position of the scan cell in the scan chain, the test value signal line 208 will be connected to an external input pin (such as the external pin 108 shown in FIG. 1), or will be connected to an output of the preceding scan cell in the scan chain (e.g., an output such as one of the signal lines 110 shown in FIG. 1). A response signal line 210 provides another input to the multiplexer 118. The response signal line 210 will be connected to some component in the functional logic 104, so that it receives a desired response value from the functional logic 104 (such as one of the signal lines 116 shown in FIG. 1). A third signal line 212 outputs the contents of the memory element 204 (e.g., an output such as one of the signal lines 110 shown in FIG. 1).

The multiplexer 202 acts as a switch, allowing either the signal value input applied to the signal line 208 or the signal value applied to the signal line 210 to pass through to the multiplexer output along to the memory element 204 via the signal line 206. The action of the multiplexer 202 depends on the value applied at the scan enable input 212. For example, with some implementations, if the value applied at the scan enable input 212 is a low voltage value (corresponding to a logical value of "0,"), then the multiplexer 202 blocks the signal value applied to the signal line 208 and passes the signal value applied to the signal line 210 to its output. Conversely, if the value applied at the scan enable input 212 is a high voltage value (corresponding to a logical value of "1,"), then the multiplexer 202 will block the signal value applied to the signal line 210 and pass the signal value applied to the signal line 208 through to its output. In the illustrated example, the memory element 204 is a D type flip-flop, but other types of memory elements may be used. The D type flip-flop 204 accepts input at a data input (labeled D in the figure). Triggered by receipt of a clock pulse at a clock pin 214 (labeled CLK in the figure), the memory element 204 provides value input at D at the output pin 109.

Returning now to FIG. 1, the scan chain 102 has three principal modes of operation. In a first mode of operation, that is, a "shifting in" or "loading" mode, test values (i.e., bit values) are loaded into the scan chain 102 by impressing a desired test value on the input pin 108 and applying a clock pulse to a clock input pin 117. For each clock pulse, the output signal of a scan cell $106_x$ is applied as input to the next scan cell $106_{x+1}$ in the scan chain. At the next clock pulse, the input value to the scan cell $106_{x+1}$ is output from that scan cell and applied as the input value to the next sequential scan cell $106_{x+2}$. As a test value is passed along from one scan cell to its downstream neighbor, a new data value is impressed at the input pin 108; this process is repeated until each scan cell 106 of the scan chain 102 has been loaded with a desired test bit. In this way, a desired set (or "pattern") of test values is passed along the scan cells 106 of the scan chain 102.

Because the scan cells 106A-106E are connected via the signal lines 114A-114E, respectively, to the functional logic 104, the signal values output from the scan cells 106 also are applied to the functional logic 104. Various signal values produced by logic gates or other components of the functional logic 104 in response to the output from the scan cells 106 then appear on the signal lines 116A-116E. These output values from the functional logic are called the "response" values or "test response." Thus, the scan cells 106 apply an input, which may be a desired pattern of test values, to the functional logic 104, which in turn provides a test response to the scan cells 106.

In a "capture" mode of operation, the conductive paths among the scan cells 106 and the output signals 116 from the functional logic 104 are reconfigured (e.g., via the operation of multiplexers 202 as shown in FIG. 2) so that the scan cells 106A-106E of the scan chain 102 receive and stores the test response values presented on the signal lines 116A-116E. As a result, each scan cell 106 captures a test response value rather than a value providing by the preceding scan cell 106. It should be understood that, with various implementations of the invention, more than one clock pulse may be utilized during the capture mode.

Finally, in a third mode of operation, the scan cells 106 switch back to storing data from their upstream neighbors and ignore inputs from the functional logic 104. In this "shifting out" or "unloading" mode, the captured test response bits move along the scan chain 102, in response to successive applications of clock pulses to the scan cells 106. As a result, the values of the test bits appear, in sequence, at the output pin 112. In this way, the response of the integrated circuit device 100 to a test pattern is communicated to automated test equipment (ATE) for storage in a test log and/or for subsequent analysis.

Blocking Components

In the scan shifting mode and the capture mode, switching activity will occur at scan cells when a transition, either 0→1 or 1→0, appears at the scan cell outputs. The transitions at the scan cell outputs are further propagated to the functional logic, which typically causes switching activity in the logic components in the functional logic. When applying a test pattern generated by an ATPG tool to test an integrated circuit device, a significant number of transitions may occur at the scan cells. These transitions result to excessive power consumption in the functional logic, which can in turn lead to heating in the device.

Figure 1B:
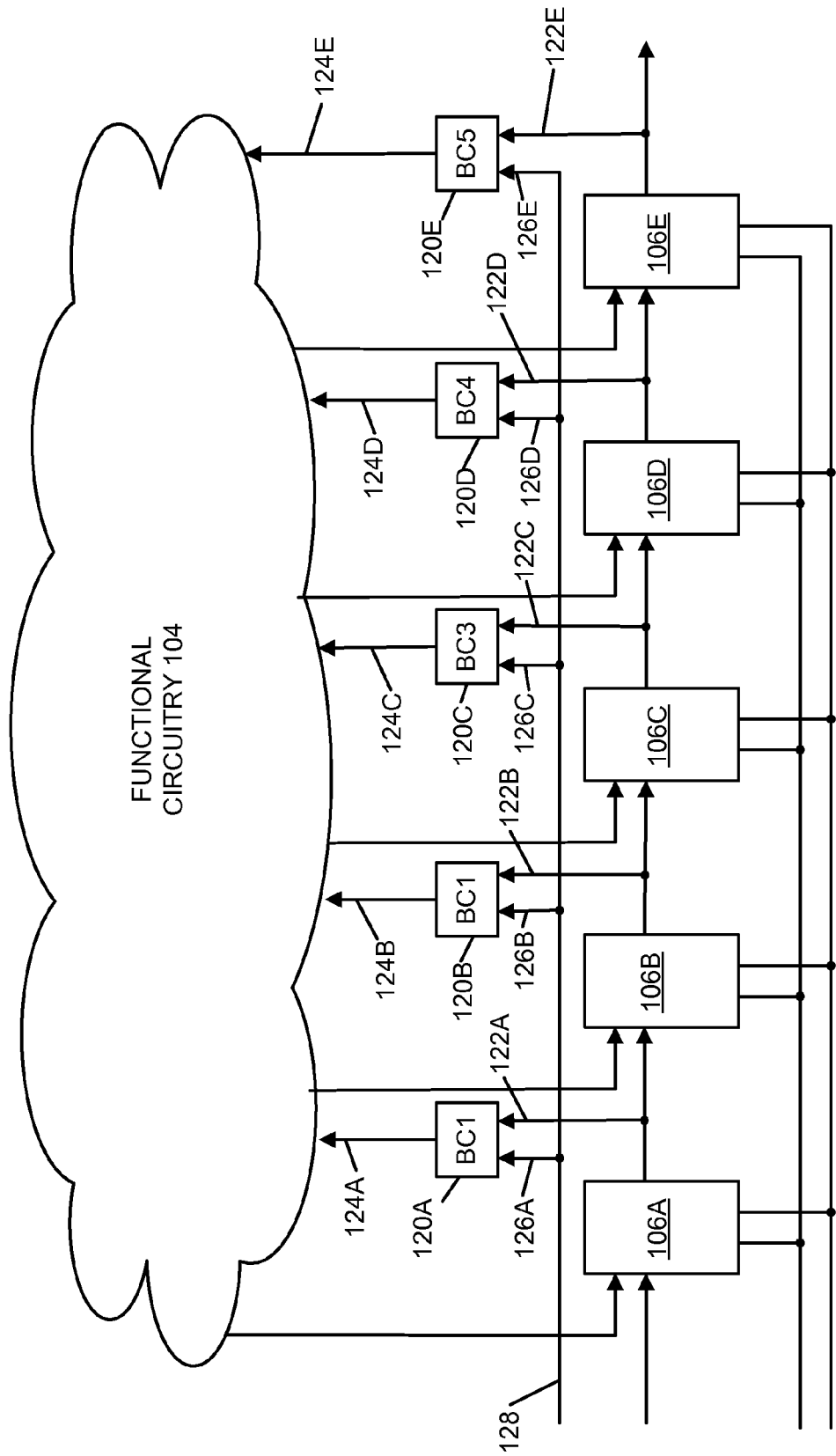
FIG. 1B shows a circuit analogous to the circuit of FIG. 1A, but with blocking components incorporated in the scan chain.

To help ameliorate this problem, blocking components are used with various implementations of the invention to prevent transitions from reaching the functional logic of the integrated circuit device. FIG. 1B shows a circuit analogous to the circuit of FIG. 1A, but with blocking components 120A, 120B, 120C, 120D, and 120E incorporated in the scan chain 102. The blocking components 120A-120E function to block scan cell transitions from propagating to the functional logic 104. In FIG. 1B, signal lines 122A-122E and 124A-124E replace signal lines 114A-114E (shown in FIG. 1A). That is to say, signal lines 122A-122E connect the corresponding scan cell outputs to the inputs of the blocking component 120A-120E. Signal lines and 124A-124E then connect the outputs of the blocking components 120A-120E to various components of the functional logic 104. Additional signal lines 126A-126E then receive a blocking control signal Block_Enable from an input pin 128.

When the Block_Enable signal is activated, the blocking components 120A-120E are enabled so that scan cell transitions are blocked from propagating to the functional logic 104. That is, the blocking components 120A-120E operate to isolate signal lines lines 122A-122E from their corresponding signal lines 124A-124E. Thus, when Block_Enable signal is activated, the functional logic 104 is isolated from the transitions made by the scan cells 106A-206E. When the Block_Enable signal is deactivated, the blocking functions of the blocking components 120A-120E are disabled, so that the test pattern bits in the scan cells 106A-106E can be applied to the functional logic 104.

The blocking components 120A-120E may be implemented in any suitable manner. For example, a logic gate such as an AND gate may function as a blocking component. By applying a logic value 0 to one input of the AND gate, referred to here as the block control input, the output of the AND gate is a logic value of 0 regardless of the other input, here referred to as the signal input. When a logic value 1 is applied to the block control input, the output of the AND gate is the same as the signal input. In an analogous way, an OR gate may function as a blocking component, providing at its output a logic value of 1 when a logic value 1 is applied to its block control input, regardless of the value applied at its signal input. When a logic 0 value is applied to the block control input, the value at the output of the OR gate is the same as the value applied at the signal input.

With some implementations of the invention, it may be desirable to configure the blocking components in a chain so that some scan cells have OR blocking components, while others have AND blocking components. As discussed below, a blocking component 120 for a given scan cell 106 may be chosen to satisfy particular testing criteria. Whatever the implementation for a given scan cell 106, with various implementations of the invention the same control signal Block_Enable can be utilized for enabling/disabling multiple blocking components 120 of different configurations, for example, through the use of an inverter.

An implementation of scan chain blocking in which each scan cell 106 has a dedicated blocking component 120 is called a full-gating scheme. An implementation of scan chain blocking in which only a proper subset of scan cells 106 in the scan chain have a blocking component 120 at their outputs is called a partial-gating scheme. Various implementations can employ either full gating schemes or be partial gating schemes, as will be understood from the discussion below.

Capture Power Reduction by Using Scan Segments and Block Enable Cells

In FIG. 2, the Block_Enable signal enables or disables isolation of the functional logic 104 from the scan chain 102. Thus, it can be used to reduce shifting power consumption in shifting mode by isolating the functional logic 104 from transitions output by the scan cells 106. As will be explained in more detail below, various implementations of the invention employ block components 224 to reduce power consumption during the capture mode, by segmenting a scan chain into scan segments so that to discrete portions of the scan chain may be selectively isolated from the functional logic 104 during the capture mode.

A scan segment is a subset of scan cells stitched contiguously in a scan chain. FIG. 3 shows a scan chain 302 that contains a single scan segment 328 that has scan cells 306A-306D and a block enable cell (BEC) 332. As will be explained in detail below, a block enable cell (BEC) a special scan cell that is inserted into the scan chain for controlling test power consumption during capture. FIG. 4 shows a scan chain 402 that has a first scan segment 428 with scan cells 406A to 406$i$, and a second scan segment 430 with scan cells 406($i$+1) to 406N. The scan segment 428 also includes a block enable cell 432, while the scan segment 430 includes a block enable cell 434. It is understood that, with various examples of the invention, a scan chain may have any number of scan segments, each with its own block enable cell. Typically each segment of a scan chain will contain multiple scan cells. For example, one industry design includes 143K scan cells and 24 scan chains divided into 50 scan segments per scan chain. With some implementations of the invention, however, a scan segment may have only a single scan cell.

During test generation, a generated test pattern typically has only a small fraction of its bits specified (A test pattern with bits specified partially is also called a test cube). As a consequence, only a few scan segments at a time are relevant for detecting the set of faults targeted by the generated test pattern. Experimental results on different industry designs indicate that, very often, locations of specified bits in a test pattern are confined to only a few scan segments. For example, in the circuit with 143K scan cells and 24 scan chains divided into 1200 scan segments, it was found that the test cubes feature specified bits in less than 4% of the scan segments. Through dynamic compaction, a test cube can be expanded, so that the percentage of scan segments with specified bits can be increased. In some implementations it is desirable to limit the number of scan segments with specified bits during dynamic compaction to no more than a certain percentage of the total scan segments. All the scan segments with unspecified bits can be utilized to reduce test power consumption by independent control of the blocking components at the scan cells of each scan segment during capture. The independent control of the blocking components is accomplished by inserting the block enable cells (BECs) into the scan chains to control each scan segment. The operation of block enable cells is demonstrated with reference to FIG. 4 as follows.

During a test application, the generated test patterns are shifted into the scan chains. To control propagation of scan cell transitions, the Global_Block_Enable signal 433 shown in FIG. 4 enables all scan cell blocking components by enabling Local_Block_Enable$_1$ signal 436 and Local_Block_Enable$_2$ signal 438 during scan shifting. During capture, the Global_Block_Enable signal 433 is set to be at inactive state and the Local_Block_Enable$_1$ 436 and Local_Block_Enable$_2$ 438 are determined by the data loaded into BEC$_1$ and BEC$_2$ during scan shifting. Depending on the data loaded at a block enable cell, the blocking components associated with the scan segment controlled by the block enable cell can either isolate the scan cells in the scan segment from the functional logic or enable the test stimuli loaded at the scan cells in the scan segment to drive the functional logic. Thus, the scan segments 428 and 430 are independently controlled by block enable cell BEC$_1$ and block enable cell BEC$_2$ during capture.

The independent control of the blocking components at each scan segment by the segments' respective block enable cells provides flexibility to reduce test power consumption during capture as described below. After a test cube is generated, it includes specified bits corresponding to particular subsets of scan segments, and those scan segments should not be blocked by their blocking components during capture. Thus, the data loaded into the block enable cells controlling the scan segments with specified bits in the generated test cube must disable isolation of those scan segments from functional logic in order to avoid any impact on test coverage. Conversely, the data loaded into the block enable cells controlling the scan segments without specified bits in the test cube should enable the blocking components to isolate those scan cells with functional logic. As a result, the test power is reduced during capture when applying the generated test pattern.

As discussed above, the functionality of the block enable cells is to dynamically control the blocking components to enable or disable isolation between scan segments and functional logic during capture. Thus, block enable cells are stitched into the scan chains in the same way as regular scan cells, and they can be placed in any position in the scan chains. To avoid routing congestion in the integrated circuit device, it is better to place a block enable cell next to the scan segment it controls. Example scan chain architectures with one or more block enable cells are shown in FIG. 3 and FIG. 4, as discussed above. In FIG. 3, all of the scan cells in the scan chain 328 are controlled by one block enable cell 332. In FIG. 4, two block enable cells 432 and 434 are stitched into the scan chain 402 to control the scan cells from 406A to 406$i$ and from 406($i$+1) to 406N, respectively.

Since the block enable cells are inline with scan segments in the scan chains (see FIGS. 3 and 4), the values to be loaded in the block enable cells can be shifted in along with the rest of test stimulus bits in a test pattern. Accordingly, the test pattern to be applied can be assembled together with the intended block enable cell control bit values into a "packet" that can be stored in automated test equipment and be shifted in to provide the test power control during capture.

FIG. 5 shows one implementation of a block enable cell 532 that may be employed according to various examples of the invention. As shown, the shift clock signal 517 is gated by the Global_Block_Enable signal 533. During scan shifting, the Global_Block_Enable signal 533 is set to have value 1 and the D flip-flop 540 shifts through scan data as a regular scan cell. At the same time, Local_Block_Enable 536 is enabled and activates the blocking components inserted at the outputs of scan cells to block the transitions generated during scan shifting. At the end of scan shifting, the Global_Block_Enable signal 533 is set to have value 0 and Local_Block_Enable 536 is controlled by the data loaded into the block enable cell 532. The clock port CLK of the D flip-flop 540 stays in off state such that the block enable cell 532 holds its loaded value during capture. When the loaded value of the block enable cell 532 is 0, the outputs of the scan cells controlled by the block enable cell are not blocked and the test pattern bits loaded into the scan cells can be used to provide a test stimulus. When the loaded value of the block enable cell 532 is 1, the outputs of the scan cells controlled by the block enable cell are blocked and the transitions at these scan cells do not propagate to the functional logic. As a result, capture power is reduced. In the context of this disclosure, a block enable cell is referred to as enabled if the loaded value in the block enable cell blocks (does not block) the outputs of the scan cells, and disabled if the loaded value in the block enable cell does not block the outputs of scan cells.

FIG. 6 shows another implementation of a block enable cell 632 that may be employed according to various examples of the invention. The block enable cell 632 operates in the same way as the block enable cell 532 shown in FIG. 5. It may be used to make the modified scan chain operate in the same way as if the block enable cell does not exist in the scan chain during capture.

Each of the implementation of the block enable cells shown in FIG. 5 and FIG. 6 holds its loaded value unchanged during capture. Thus, it would not introduce an additional unknown value during unloading test responses from the scan chains. But it does not provide a way to isolate a different set of scan segments at different capture cycles in a test pattern. To improve flexibility of controlling test power consumption at each capture cycle in capture mode, a block enable cell can be enhanced to include multiple state elements operated in a pipeline fashion. A state element can be, for example, a flip-flop or latch, that is, an element that can hold a particular logic state. The data loaded at each state element in a block enable cell control the block components of a scan segment at each capture cycle independently.

Figure 19:
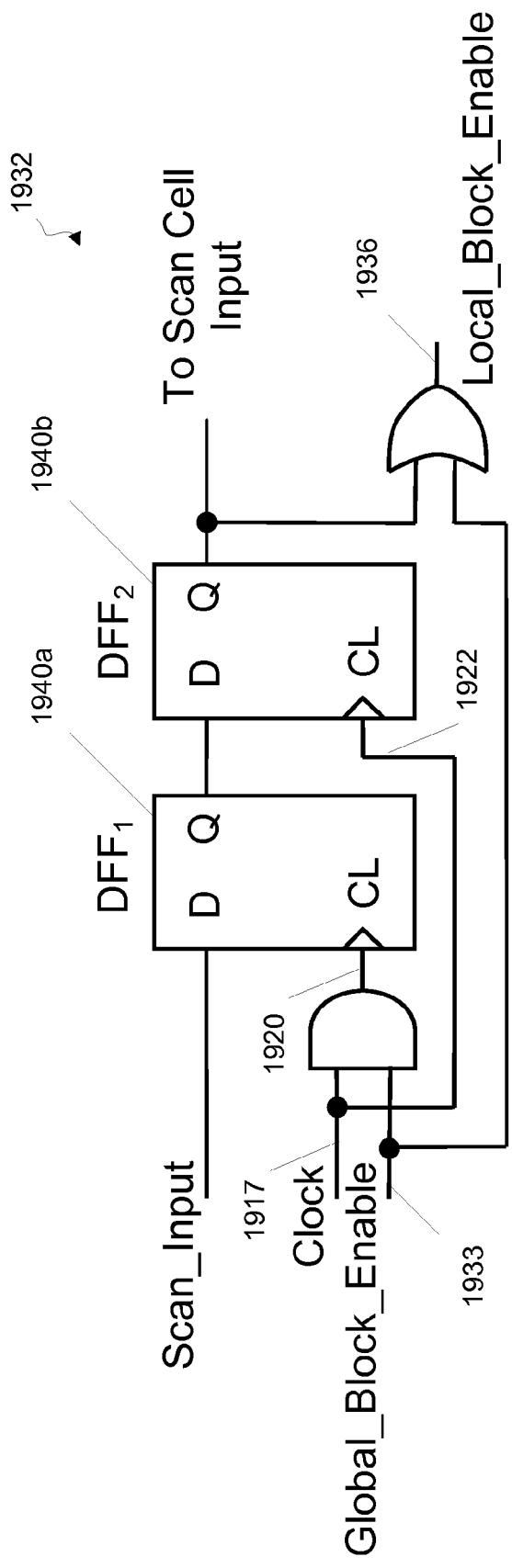
FIG. 19 shows an implementation of a block enable cell including multiple state elements.

FIG. 19 shows an implementation of a block enable cell 1932 with two D flip-flops that form a two-stage pipeline that may be employed according to various examples of the invention. Here, it is assumed that the same clock 1917 is used for both scan shifting and capture. It should be understood that the method described can be applied to the situation when shifting clock and capture clock are different. The clock port 1920 of $DFF_1$ 1940a is driven by the clock 1917 gated by the Global_Block_Enable signal 1933. The clock port 1922 of $DFF_2$ 1940b is driven by the clock 1917 directly. During scan shifting, the Global_Block_Enable signal 533 is set to have value 1 and the D flip-flops 1940a and 1940b shifts through scan data as a regular scan cell. At the same time, Local_Block_Enable 1936 is enabled and activates the blocking components inserted at the outputs of scan cells to block the transitions generated during scan shifting. At the end of scan shifting, the Global_Block_Enable signal 1933 is set to have value 0 and Local_Block_Enable 1936 is controlled by the data loaded into the D flip-flop $DFF_2$ 1940b for the first capture cycle and the data loaded into the D flip-flop $DFF_1$ 1040a for the rest of capture cycles. (The data loaded into $DFF_1$ is shifted into $DFF_2$ after pulsing capture clock 1917 to control Local_Block_Enable 1936). The clock port CLK of the D flip-flop $DFF_1$ 1940a stays in the "off" state so that the Local_Block_Enable signal 1936 is determined by the load data at the $DFF_1$ 1940a for all the capture cycles except the first capture cycle. When the loaded value of the $DFF_2$ 1940b is 0, the blocking components driven by Local_Block_Enable signal 1936 are disabled and the test pattern bits loaded into the scan cells can be used to provide a test stimulus. When the loaded value of the $DFF_2$ 1940b is 1, the blocking components driven by Local_Block_Enable signal 1936 are enabled and the transitions at these scan cells do not propagate to the functional logic in the first capture cycle. Similarly, the loaded value at $DFF_1$ controls if the blocking components driven by Local_Block_Enable signal 1936 are enabled or disabled for the rest of capture cycles. Although the example shown above has a two-stage pipeline, it should be understood that as many pipeline stages as necessary can be implemented to improve the flexibility of controlling test power consumption during capture at different capture cycles.

Besides the incorporation of block enable cells into scan chains to control the scan segments, the choice of types of blocking components on the scan cells of the scan segments may also be significant. As previously discussed, the blocking component for a particular scan cell can be configured to hold either logic value 0 or logic value 1 when Block_Enable (see FIG. 1B) is set to enable blocking, that is, when Block_Enable has logic value 1. To hold logic value 0 when Block_Enable has logic value 1, the blocking component can include an inverter whose output is presented to the block control input of an AND gate used as the blocking component. To hold logic value 1 when Block_Enable has logic value 1, the blocking component can include an OR gate. During scan shifting, there is no difference in terms of shift power reduction when using different holding value, logic value 0 or logic value 1. However, the selection of holding value can have great impact on power consumption when switching from scan shifting mode to capture mode and when carrying out capture, as illustrated in FIGS. 7 and 8.

Figure 7:
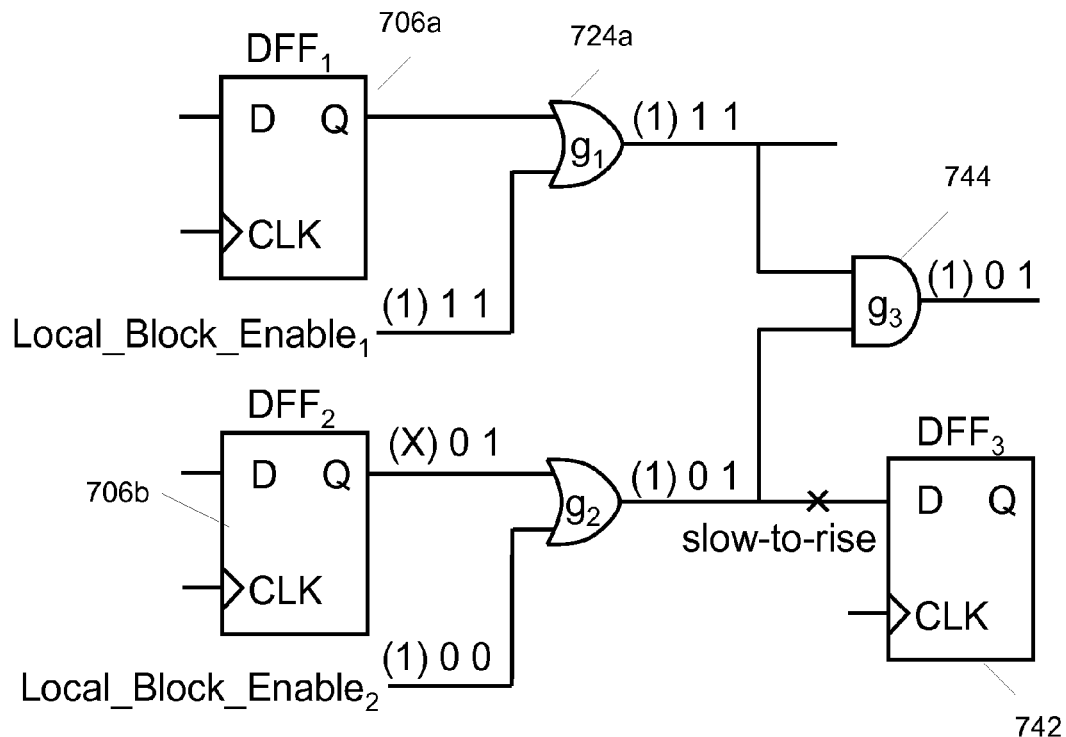
FIG. 7 shows a circuit with scan cells belonging to different scan segments and controlled by different BECs.
Figure 8:
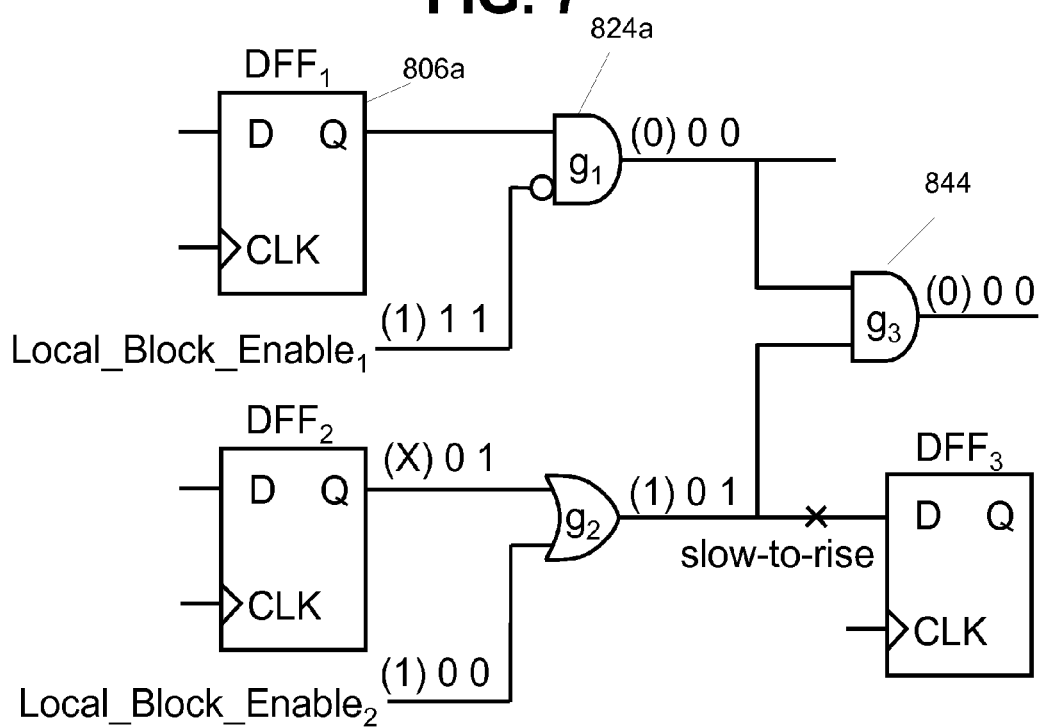
FIG. 8 shows a circuit similar to that of FIG. 7, but with an OR gate replaced by a NAND gate.

In FIG. 7, scan cells 706a and 706b belong to different scan segments and are controlled by different block enable cells (not shown). The output of scan cell 706a is gated by an OR gate that acts as blocking component 724a. To detect a slow-to-rise transition fault at the D-input of $DFF_3$ 742, the value at the scan cell 706a does not matter. To reduce the capture power, logic value 1 can be assigned to the block enable cells that controls scan cell 706a. As a result, the OR gate $g_1$ 724a holds constant value 1 during scan shifting and during capture.

In the figure, the logic values shown in parenthesis are the logic values during scan shifting, when Global_Block_Enable 433 (see FIG. 4) is asserted. The two logic values that follow the value in parentheses are those occurring during capture. It can be seen that there are two transitions at gate $g_3$ 744. One transition from 1 to 0 occurs when switching from scan shifting mode to capture mode and the other transition from 0 to 1 occurs after applying the launching clock to create a transition at the scan cell 706b output. If instead of an OR gate at the output of scan cell 706a, a blocking component implementation 824a with an AND gate is used at the output of scan cell 806a (see FIG. 8), it can be seen from FIG. 8 that no transition occurs at the gate $g_3$ 844.

The example discussed in connection with FIGS. 7 and 8 demonstrate the significance of selecting appropriate blocking components at the outputs of scan cells in order to maximize capture power reduction. One fill method that achieves dramatic capture power reduction and in which the fill values are pattern independent has been proposed in S. Remersaro, X. Lin, Z. Zhang, S. M. Reddy, I. Pomeranz, and J. Rajski, "Preferred Fill: A Scalable Method to Reduce Capture Power for Scan Based Designs", Int. Test Conf., pp. 32.2.1-32.2.10, 2006, which is incorporated entirely herein by reference. The preferred fill values according to the Remersaro et al. method can be used to determine the type of blocking component inserted at the outputs of a scan cell.

That is, a blocking component that uses an AND gate with an inverter is used if the preferred fill value at a scan cell is 0. Otherwise, a blocking component that uses an OR gate is used.

Figure 9:
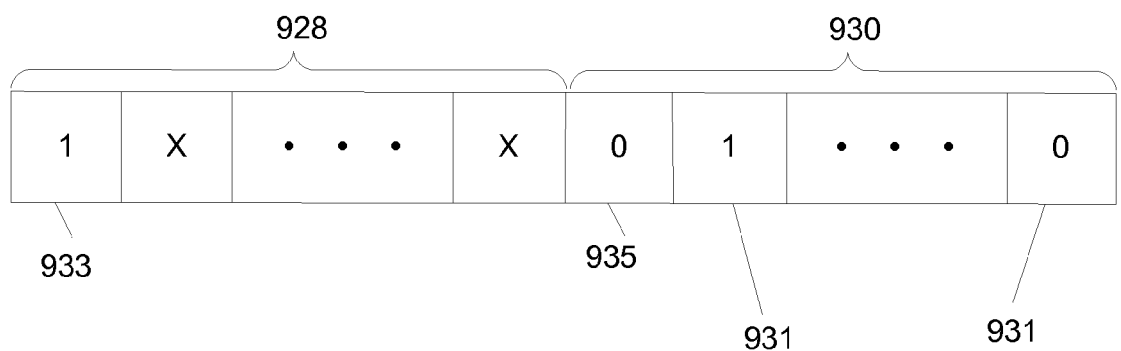
FIG. 9 shows a test pattern with portions that correspond to the scan segments of FIG. 4.

As just discussed, selection of appropriate blocking components is significant for reduction of capture power consumption when testing scan based design. Generation of test patterns that meet the particular restriction of test power consumption as well as maximizing test power reduction are also significant. First, the scan segments to enable, and those to disable, for a particular test pattern, are to be selected during test pattern generation. For example, FIG. 9 shows a test cube with portions 928, 930 that correspond to the scan segments 428 and 430 of FIG. 4. Each portion of the test cube can be examined to determine whether the portion contains any specified test bits. In FIG. 9, the portion corresponding to the first scan segment of FIG. 4 includes no specified bits (Unspecified bits are denoted with Xs). The portion corresponding to the second scan segment contains specified bits 931, for example, bit 1 to be shifted in to scan cell 406c and bit 0 to be shifted in to scan cell 406d. It is understood that the control bits are loaded into the BECs during scan shifting to load test data into the scan segment.

If no test bits in the portion are specified, a bit value of 1 is assigned to enable the block enable cell, as shown 933 for the first portion 928 in FIG. 9. The block enable cell control bit value of 1 enables blocking of transitions that may take place in the scan segment during capture. If one or more test bits in the portion are specified, a bit value of 0 is assigned to disable the block enable cell, as shown 935 for the second portion 930 in FIG. 9. The block enable cell control bit value of 0 allows the test stimulus bits in the scan segment to reach the functional logic during capture. In this manner the control data at all the block enable cells in the integrated circuit device are determined so that transitions during capture, in scan segments that are irrelevant for testing with a particular test pattern, are blocked from propagation to the functional logic of the integrated circuit device, so that test power consumption during capture can be reduced.

Next, the maximal number of block enable cells to be disabled for a test cube may be controlled during test cube generation with dynamic compaction. When expanding a test cube to detect an additional fault, the expanded test bits in the test cube are kept if the number of block enable cells to be disabled does not become greater than a predefined threshold. Otherwise, the expanded test bits are discarded by resetting them to unknown values.

An example of pseudocode that describes the test generation flow by utilizing block enable cells to reduce test power consumption during capture is set forth in the following procedure generate_tests_with_BECs(N), where N is the maximal number of block enable cells allowed to be disabled when generating a test cube.

The steps of the example procedure generate_tests_with_BECs(N) are as follows:
1. While target fault list F is not empty, do:
   (a) Set test cube C to be an all-X pattern (that is, all bits unspecified).
   (b) Pick a fault f from F and remove it from F.
   (c) Generate test cube $C_f$ for f.
   (d) If f is untestable, continue from step 1.
   (e) Merge $C_f$ with C and set S to be the number of scan segments with BECs disabled in C.
   (f) Mark every fault in F as untried.
   (g) While there exist untried faults in F and S is not greater than N, do:
      I. Pick an untried fault g from F and mark it as tried.
      II. Assign C to $C_g$.
      III. Expand $C_g$ by specifying additional Xbits in $C_g$ to detect g.
      IV. If fault g cannot to be detected by expanding $C_g$, or the number of scan segments with BEC diabled in $C_g$ is greater than N, continue from step 1(g).
      V. Remove g from F.
      VI. Assign $C_g$ to C and set S to be the number of scan segments with BEC disabled in C.
   (h) If S is less than N, randomly select (N-S) unspecified BECs in C and assign logic value 0 to disable the selected BECs.
   (i) Generate a new test pattern t by filling all unspecified BECs in C with logic value 1 and filling rest of unspecified bits in C randomly.
   (j) Fault simulate t and drop detected faults from F.
   (k) Add t to test set T.
2. Return generated test set T.

It should be noted that the method acts of the example procedure can be performed alone or in various combinations and subcombinations with one another depending on the implementation.

The step 1h described in the above example procedure is an optional step to achieve a tradeoff between test pattern count and capture power reduction since randomly filling more scan segments with BEC disabled tends to detect more untargeted faults during fault simulation.

The above disclosure to reduce test power consumption during capture is based on using block enable cells to control scan segments independently. It should be understood that a block enable cell can also be applied in the circumstance to control a subset of scan cells not stitching continuously as a scan segment and/or not included in the same scan chains. Under this situation, the method to reduce the test power consumption during capture can nonetheless be implemented in the same way as the case when using block enable cell to control scan segments. It should be also understood that the above disclosed method can be used in the circumstance with a partial-gating scheme, i.e., where not all the scan cells have blocking components added at scan cell outputs. Under this latter situation, one or more block enable cells are used to control the isolation from the functional logic of the scan cells with blocking components at their outputs.

Test Power Reduction in a Compression Environment

The above-discussed approach to reduction of power consumption during capture using scan segments can be adapted for use in a test compression environment. A test compression environment uses compression techniques to reduce test data volume and test application time. Various test compression techniques have been proposed. A typical on-chip compression architecture is shown in FIG. 10.

FIG. 10 shows automated test equipment (ATE) 1050 that provides compressed stimuli 1052 through one or more scan channels 1054 to a decompressor 1056 incorporated in an IC device 1000. When testing the integrated circuit device 1000, the compressed stimuli 1052 from ATE 1050 are decompressed by the decompressor 1056 before shifting into the scan chains 1002a, 1002b, . . . , and 1002n of the IC device 1000. The test responses captured into the scan chains are compressed by the on-chip compactor 1058 before sending to the ATE 1050 for storage and analysis.

The compression ratio for test stimuli 1052 is determined by the encoding capacity of the decompressor 1056 and the number of specified bits in each test cube. During on-chip decompression, the unspecified bits in the test cubes are typically filled with pseudo-random values generated by the decompressor 1056, and therefore excessive switching activity may occur in the functional logic 104 (see FIG. 1A) during capture.

Due to the limitation of the encoding capability of the decompressor 1056, it is difficult to apply filling based methods, such as, for example, the preferred fill method discussed above, to reduce the power consumption during capture. Block enable cells 532 (see FIG. 5) whose control bits are not specified in the test cube will receive pseudo-random values as well during on-chip decompression. Thus, when block enable cells 432, 434 (see FIG. 4) inserted into scan chains are applied to reduce capture power, theoretically half of the block enable cells with unspecified control bits will be enabled after the pseudo-random fill. Clearly, to maximize the reduction of power consumption during capture, it is not a good strategy to randomly fill block enable cells 532 whose control bits are unspecified in the test cube. Although it is possible to use a decompressor to encode all block enable cell control bits after specifying them explicitly first, it will reduce the encoding capability for test stimulus bits. In the worst case, it may make a testable fault become untestable due to lack of encoding capacity.

Figure 11:
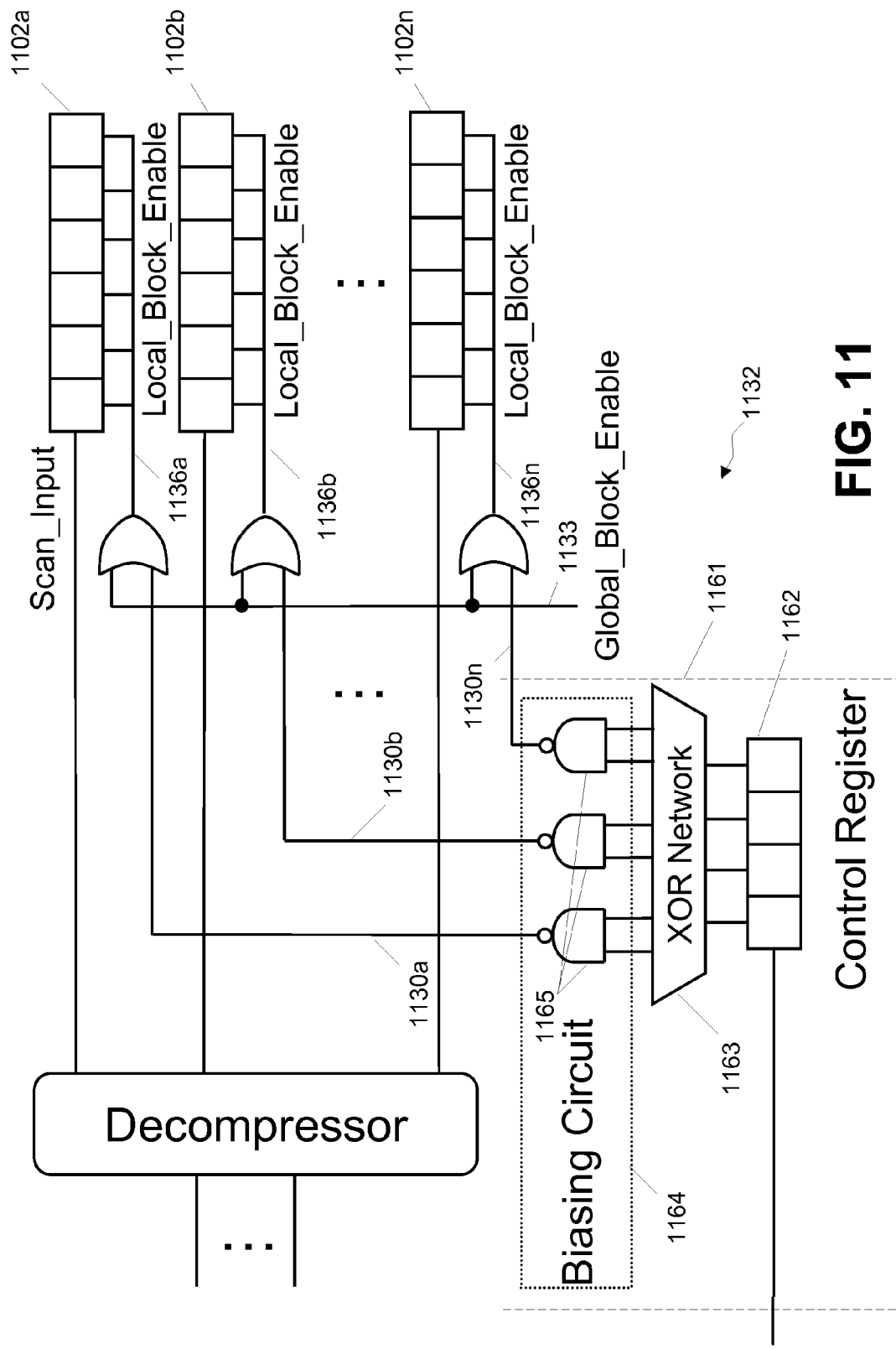
FIG. 11 depicts a programmable block enable architecture that can be used in a test compression environment.

To help maximize test power reduction during capture without impacting encoding capability for the test stimulus bits, block enable cells are implemented in an alternative way. FIG. 11 depicts a programmable block enable architecture 1132 that can be used in a test compression environment. The Local_Block_Enable signals 1136a, 1136b, . . . , and 1136n are generated by a dedicated control block 1161. The control block 1161 is programmable and includes a control register 1162, combinational XOR logic 1163, and an optional biasing circuit 1164. The control block 1161 outputs independent block enable signals 1130a, 1130b, . . . , and 1130n to control each scan chain 1102a, 1102b, . . . , 1102n. The independent block enable signals 1130a-1130n are gated with a Global_Block_Enable signal 1133 before connecting to Local_Block_Enable signal lines 1136a, 1136b, . . . , 1136n.

When the Global_Block_Enable signal 1133 has a value of 0, the compressed control data loaded into the control register 1162 determines the set of Local_Block_Enable signals 1136a-1136n to be enabled. The control data is shifted into the control register 1162 at the same time the test stimuli are shifted into scan chains 1102a, 1102b, . . . , and 1102n. When shifting a constant value of 1 into the control register 1162, all Local_Block_Enable signals 1136a-1136n are disabled (assuming that each XOR network 1163 output is driven by an odd number of D flip flops in the control register 1162). The biasing circuit 1164 is used to increase the probability to enable the Local_Block_Enable signals 1136a-1136n. The NAND gates 1165 allow approximately 75% of Local_Block_Enable signals to be enabled. If the biasing circuit 1164 is not used, approximately 50% of Local_Block_Enable signals are enabled.

The implementation shown in FIG. 11 is equivalent to insertion of one block enable cells 332 (see FIG. 1B) per scan chain. It is possible to increase the number of outputs from the programmable control block 1161 to drive independent Local_Block_Enable signals that will control different scan segments in the scan chains. Typically, though, a scan chain used in a non-test compression environment is reconfigured into a set of multiple shorter scan chains in a test compression environment. Therefore, it may not be necessary to control a scan chain with multiple independent Local_Block_Enable signals, although controlling a scan chain with multiple independent Local_Block_Enable signals provides better control for the reduction of power consumption during capture.

Figure 12:
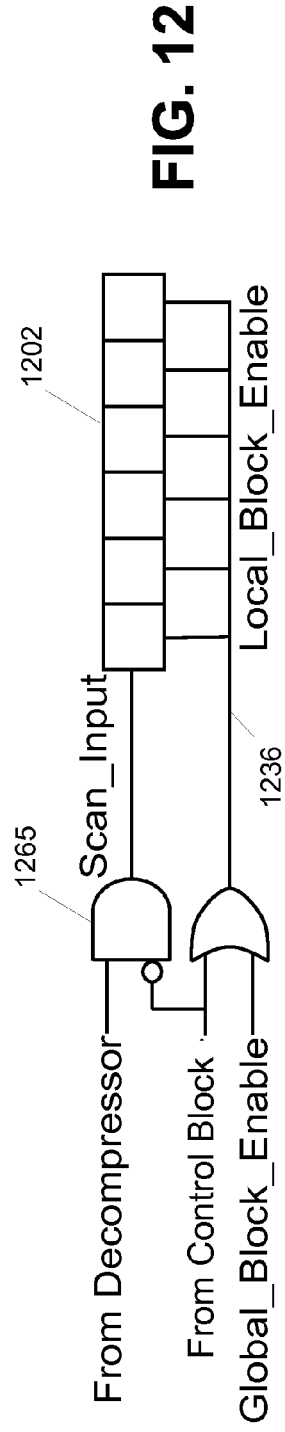
FIG. 12 shows an AND gate added at a scan chain input.

In some implementations, the control data is loaded before shifting in test stimuli into the scan chains. In this circumstance, the scan shift power can be reduced further by reducing the number of transitions occurring in scan cells during scan shifting. This is achieved by adding an AND gate 1265, with the input driven with inverted output from control block 1161 (see FIG. 11), at a scan chain 1202 input as shown in FIG. 12. The added AND gate 1265 makes the scan chain 1202 load with constant value 0 when the corresponding Local_Block_Enable 1236 is asserted during capture. An analysis on the distribution of the preferred values shows that a majority of scan cells have a preferred value of 0. Thus, shifting in constant value 0 in the scan chains with block enable cells enabled can also help to reduce switching activity at scan cells during capture. It should be understood that a two-input OR gate can be used to replace AND gate 1265 to load the scan chain with constant 1 in some circumstances. One of the OR gate inputs is driven by the output of the decompressor and the other OR gate input is driven by the output of control block 1161 shown in FIG. 11.

Scan Shifting Power Reduction by Using Partial Gating Scheme

To reduce scan shifting power, the full-gating scheme discussed above adds blocking components to all the scan cells in a scan chain to achieve maximal scan shifting power reduction. However, it suffers from high area overhead by consuming valuable die area to implement the blocking components. To achieve a tradeoff between scan shifting power reduction and area overhead, a partial gating scheme, in which blocking components are added to a proper subset of the scan cells, can be used instead.

Figure 13:
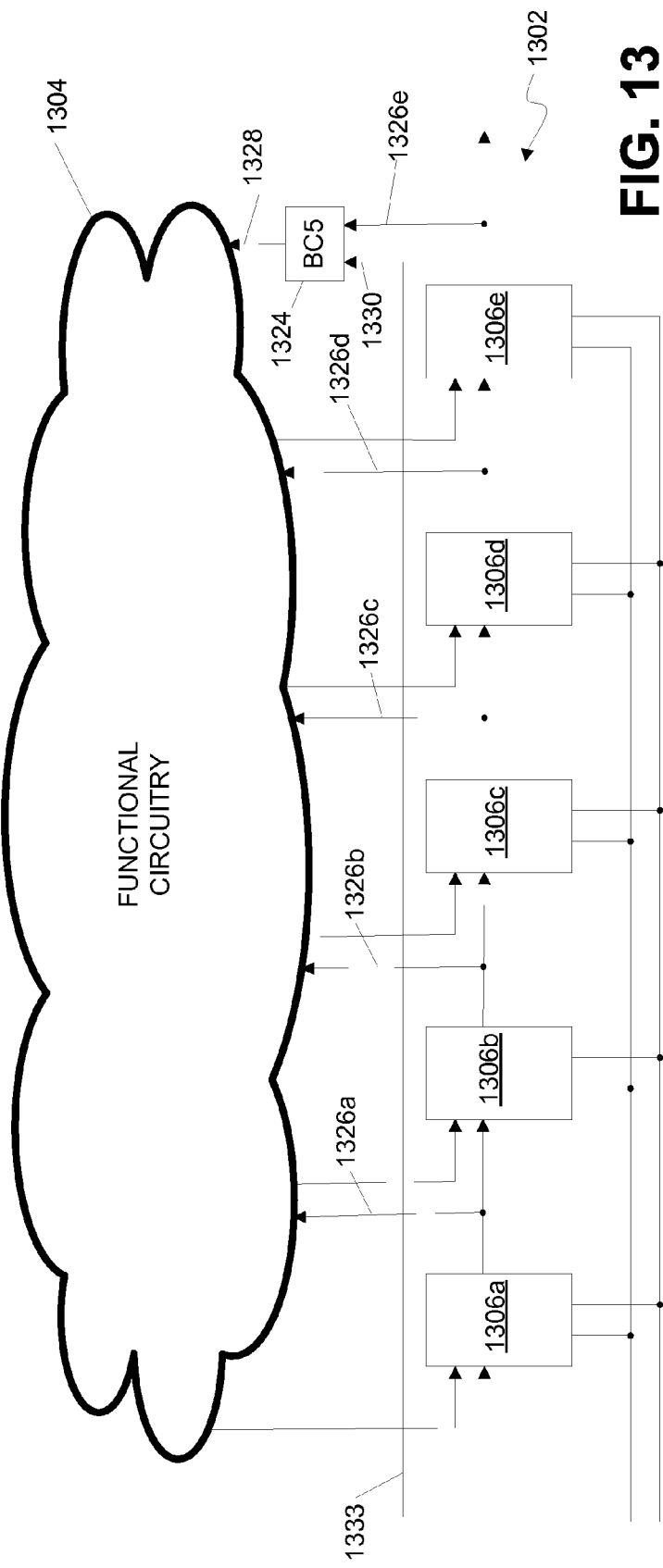
FIG. 13 shows a scan chain with a partial gating scheme.

FIG. 13 shows a scan chain 1302 with a partial gating scheme. The scan chain 1302 includes five scan cells, 1306a-1306e, that can provide inputs to the functional logic 1304. A blocking component 1324 is added to only one scan cell, 1306e. Scan cells 1306a-1306d provide inputs 1326a-1326d to the functional logic 1304 with no blocking.

The blocking component 1324 receives scan cell input 1326e and provides output 1328 to the functional logic. As discussed previously in connection with FIG. 1B, the blocking component is controlled by a Block_Enable signal 1333. The Block_Enable signal is received via a blocking control signal line 1330. When the Block_Enable signal is set to a logic value 1, the blocking component presents to the functional logic 1304 a pre-selected output 1328 value. When the Block_Enable signal is set to a logic value 0, blocking is disabled and the blocking component passes the scan cell output 1326e through to the functional logic 1304. Thus the die area used for blocking scan cell transitions is reduced by 80% (over FIG. 1B) in this example.

In FIG. 13, there is no indication of the impact scan cell 1326e has on transition rates of the functional logic 1304, vs. the impact the other scan cells 1326a-1326d have. In integrated circuit devices, some scan cells, referred to as power sensitive scan cells, have a much larger impact on transition rates at the internal signal lines than do other scan cells. Selection of the most power sensitive scan cells to receive blocking components in a partial gating scheme can achieve best tradeoff between scan shifting power reduction and die area overhead for implementing blocking components. For example, experimental results show that blocking transitions from 5% of the total number of scan cells can reduce the average scan shift power consumption by more than 45%. A strategy for selecting scan cells on which to place blocking components is described below.

The selection strategy assesses the impact of a scan cell transition on the rate of transitions in the functional logic. This impact is assessed by comparing the rate of transitions in the functional logic when transitions in the scan cell are not blocked, with the rate of transitions in the functional logic when the transitions of the scan cell are blocked. The rate of transitions in the functional logic is determined in terms of the signal probability of a signal line.

The signal probability of a signal line is defined as the probability that the value of the signal line is set to a logic value v, v∈{0, 1}, by a random test pattern. The random test pattern models the actual input that may be provided to the scan chains of the integrated circuit device during automated testing. As discussed above, scan shifting leads to transitions in scan cells propagating to the functional logic, unless blocked by blocking components. Because the applied test pattern can be considered as a random input, the signal line values can be examined using methods of probability and statistics.

Statistical analysis is an effective way to gauge the impact of scan cell transitions in large designs because such integrated circuit device designs contain thousands of scan cells. One way to carry out a statistical analysis is use Monte Carlo methods, which can consume large amounts of computer time. Another way is to do a probability analysis on the functional logic.

To carry out a probability analysis, first, signal lines in the functional logic are identified as either internal signal lines, or as those that receive an input, either a primary input or a pseudo primary input. A primary input (PI) to the functional logic is one which comes from an external pin of the IC device. It may, for example, be applied as part of a test pattern by the automated test equipment. A pseudo primary input (PPI) to the functional logic is one which comes from a scan cell output. In other words, an internal signal line is one connected neither to an external pin of the device, nor to a scan cell output.

Next, for each signal line a pair of probability values is determined. The first value is the probability that, on average, the signal line carries a logic value of 0. The second value is the probability that on average the signal line carries a logic value of 1. For signal lines that receive primary or pseudo primary inputs, PI or PPI, the pair of probability values is determined as (0.5, 0.5). That is, during test, signal lines connected directly to PI or PPI can be expected, 50% or the time, to carry a logic value of 0, and to carry a logic value of 1 the other 50% of the time. For the internal signal lines, the pair of probability values is determined by propagating input logic probability values forward through the logic gates of the functional logic.

Figure 14:
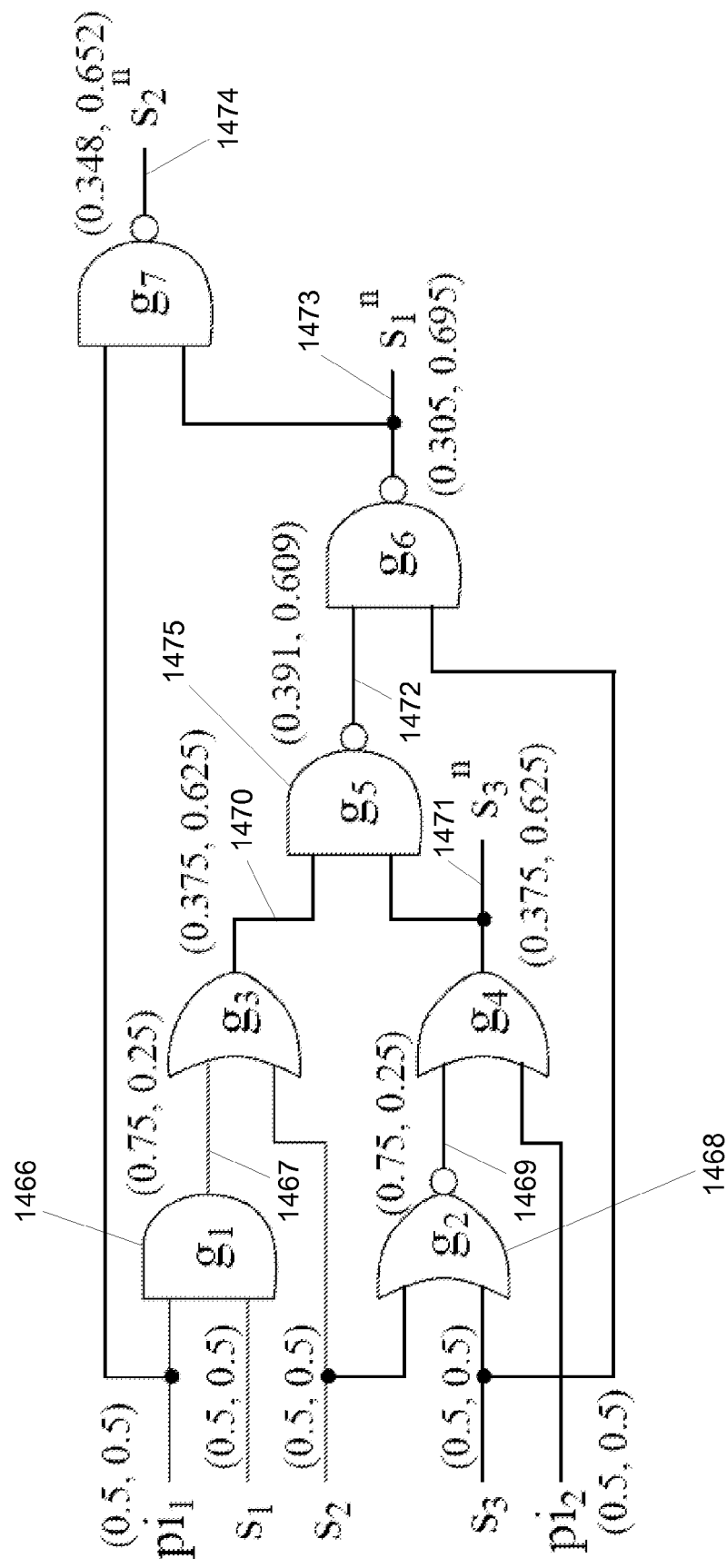
FIG. 14 provides an example of the propagating of logic probability values.

The circuit shown in FIG. 14 provides an example of the propagating of logic probability values. The circuit includes five input signal lines, the two PI lines $pi_1$ and $pi_2$, and the three PPI lines from scan cells $s_1$, $s_2$, and $s_3$. Each of the input lines is assigned a pair of probability values (0.5, 0.5), as shown.

The gate $g_1$ 1466 is an AND gate. It receives as input the primary input $pi_1$ and the pseudo primary input $S_1$. Since gate 1466 is an AND gate, it has an output value of 1 only when both its input values are 1. On average, $pi_1$ has value 1 half of the time. On average, $S_1$ has value 1 half of the time. In this calculation, the input values are taken to be uncorrelated. Thus, on average, the AND gate 1466 has an output value of 1 one quarter of the time. Its output value is 0 the remaining three quarters of the time, on average. Thus, the pair of probability values to be associated with its output is determined to be (0.75, 0.25). An analogous calculation for the NOR gate 1468 yields an identical result: Its output has a value 1 only when both its input values are zero, which occurs on average only 25% of the time.

The calculations with gates 1466 and 1468 show how input probability values are propagated through the logic gates, to provide the probability pair values on the signal lines 1467 and 1469. Similar calculations show that the probability pair values on signal lines 1470, 1471, 1472, 1473, and 1474 are determined as shown. The probability values on the signal lines provide probability values that the logic gate driving the signal line, for example, logic gate $g_5$ 1475 driving signal line 1472, presents the associated output value.

In the signal probability calculation procedure illustrated in FIG. 14, statistical correlations between gate inputs are ignored. For example, the two inputs 1470 and 1471 of the gate $g_5$ are correlated, but their correlation is ignored in computing the signal probability at the output of $g_5$ 1475.

In the present calculation, a metric is defined and used to estimate how much a scan cell contributes to power consumption during scan shifting, due to its transitions. The metric is based on estimation of a transition rate or toggling rate through probability analysis, both without and with a blocking component for the scan cell. In the context of transitions in the functional logic induced by scan cell transitions, the terms transition rate and toggling rate may be used interchangeably. The metric quantifies the toggling rate reduction (TRR), and is test pattern independent. Through use of this metric, scan cells can be ranked to decide to which scan cells addition of blocking components would be most effective. A scan cell which has a blocking component operating to block the scan cell transitions from propagating is hereinafter referred to as a frozen scan cell.

After assigning to every PI and PPI an equal probability of 0 and 1, the signal probabilities at the internal signal lines are calculated. The toggling probability, TP, at a signal line i is calculated as follows:

$$TP_i = P_i(0) \times P_i(1) \times W_i \quad (1)$$

where $P_i(0)$ and $P_i(1)$ are signal probabilities of signal line i being 0 and 1, respectively; and $W_i$ is a weighting factor to take into account loading capacitances driven by the signal line i. In various implementations, $W_i$ can be set to be 1 so that the impact of the loading capacitances on power consumption is ignored. In various other implementations, the loading capacitances can be estimated by using number of fanout gates the signal line i drives, or more accurately loading capacitances can be extracted from the physical layout of the IC device. The toggling rate, TR, of the whole circuit is defined as below:

$$TR = \Sigma TP_i \quad (2)$$

where the sum is over all the signal lines i in the circuit. For the circuit shown in FIG. 14, the toggling rate, TR, is equal to 2.77.

In order to determine the power sensitivity of every scan cell, the toggling rate reduction (TRR) metric is used. The TRR of a scan cell $s_i$ is computed by using the following procedure. First, the signal probability of every signal line in the circuit is computed by assigning to every PI and PPI an equal probability for 0 and 1. Next, the initial toggling rate TR of the circuit is computed using equation (2).

Continuing with the computation of TRR, the toggling rate is recalculated, but with the output of the scan cell $s_i$ replaced with a logic value 0 or 1. For example, for logic value 0, the signal probabilities at $s_i$ are set to (1.0, 0.0) and propagated through the functional logic to produce new signal probability values $TP_i$. Then equation (2) is used to determine the toggling rate when the output of the scan cell $s_i$ replaced with a logic value 0, denoted $TR_{si=0}$. Similarly, for logic value 1, the signal probabilities at $s_i$ are set to (0.0, 1.0) and propagated through the functional logic to produce another new signal probability values $TP_i$. Then equation (2) is used again to determine the toggling rate when the output of the scan cell $s_i$ replaced with a logic value 1, denoted Finally, the value of the metric TRR is computed as $$TRR = TR - \{\text{minimum of } TR_{si=0}, TR_{si=1}\} \quad (3)$$

Figure 15:
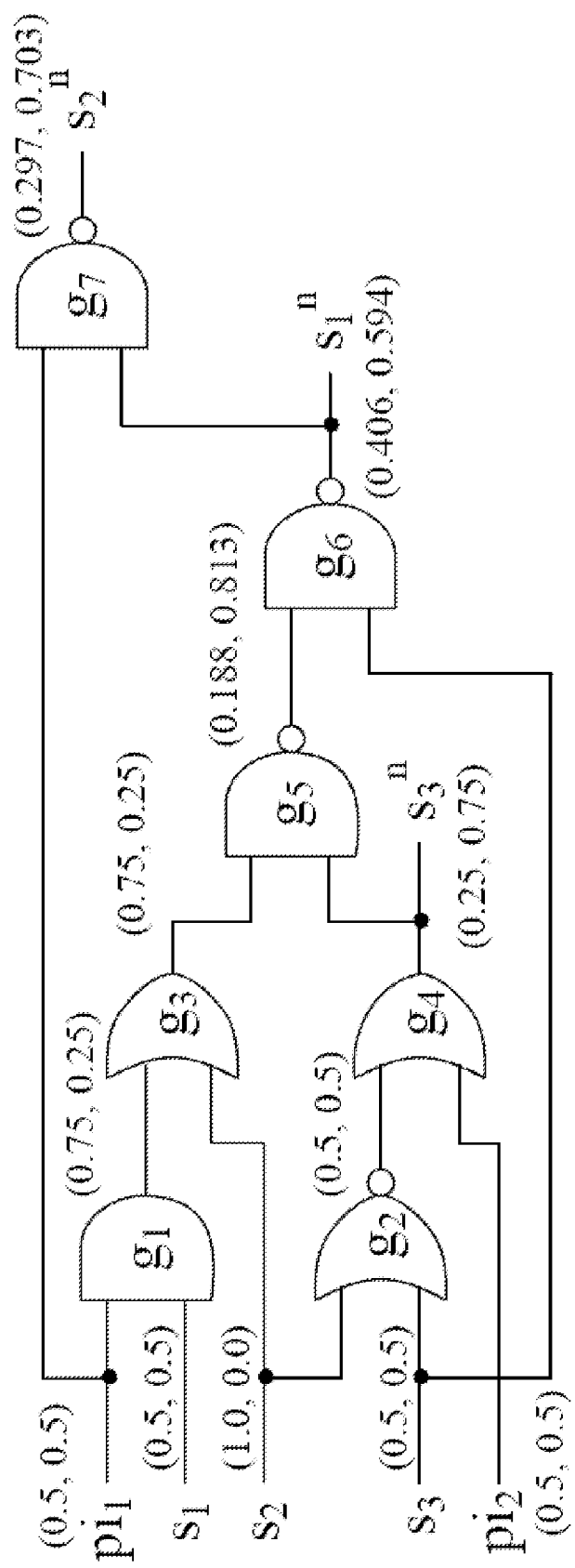
FIG. 15 shows an example calculation of scan cell power sensitivity.
Figure 16:
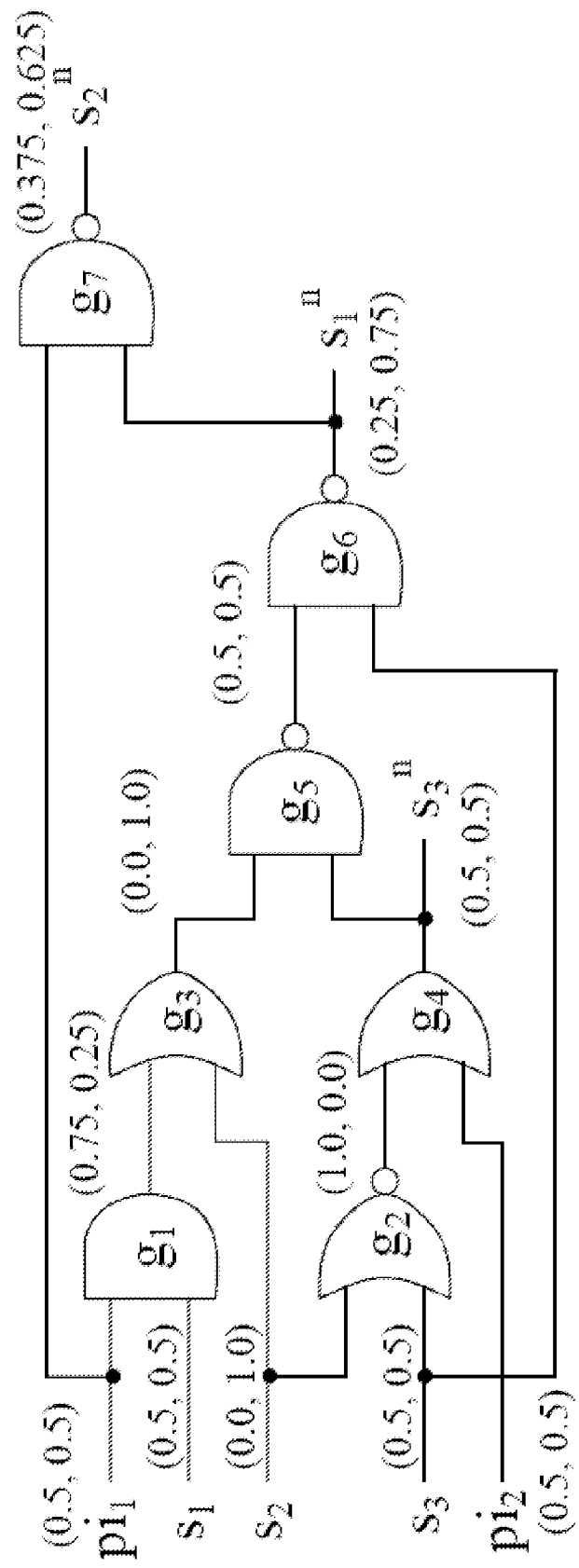
FIG. 16 shows an example calculation of scan cell power sensitivity.

FIGS. 15 and 16 show an example calculation of scan cell power sensitivity. In FIG. 15, the signal probabilities after freezing the PPI $s_2$ to the values 0 and 1, respectively, and their toggling rates are seen to be $TR_{s2=0}=2.415$ and $TR_{s2=1}=2.109$. Thus, $TRR_{s2}$ is equal to 0.661. Similarly, the TRR at $s_1$ and $s_3$ can be computed to be 0.438 and 0.537, respectively. The meaning behind the TRR is that a transition at a scan cell $s_i$ may cause more internal signal lines to be toggled than a transition at another scan cell $s_j$ when $TRR_{si}$ is larger than $TRR_{sj}$. The scan cell $s_i$ is termed more power sensitive than the scan cell $s_j$. In FIG. 14, $s_2$ is the most power sensitive cell among all three scan cells.

After scan cell power sensitivity has been calculated for all the scan cells in an IC design, the scan cells are sorted in decreasing order of their TRR values. Then the top f %, of scan cells in the ordered list are selected and their outputs frozen during scan shifting. The fraction f % is selected according to design criteria. The frozen value of a scan cell $s_j$ is determined as follows.

If $TR_{si=1}$ is smaller than $TR_{si=0}$, the frozen value is 1. Otherwise, the frozen value is 0. For example, if only one scan cell is allowed to be frozen in FIG. 14, the most power sensitive scan cell $s_2$ is selected and its frozen value is chosen to be 1 since $TR_{s2=1}$ is smaller than $TR_{s2=0}$. It is unnecessary to know the exact TRR values since the TRR values derived from the signal probability are only used to order the scan cells. An example design flow that implements this method is discussed in the next section.

Before describing the example design flow, two refinements of the disclosed methods are discussed. In a first refinement, values for primary inputs are selected to further reduce toggling rates in the functional logic due to scan cell transitions during scan shifting. In a second refinement, correlations among scan cells are taken into consideration when selecting the fraction f % discussed above. The two refinements may be applied either separately or together.

In the first refinement, values for primary inputs applied during scan shifting are selected to further reduce toggling rates of components in the functional logic. It has been shown in T. -C. Huang and K. -J. Lee. "Reduction of Power Consumption in Scan-Based Circuits during Test Application by an Input Control Technique," IEEE TCAD, Vol. 20, No. 7, July 2001, pp. 911-917, which article is incorporated entirely herein by reference, that a carefully selected set of primary input values can reduce toggling rates at the internal signal lines of functional logic when the selected set of values is applied during scan shifting. However, the automatic test pattern generator (ATPG) based approach proposed by Huang and Lee is time consuming, and cannot guarantee that an optimal solution will be found. In this disclosure, the toggling rate calculation described above is used instead to guide the selection of primary input values to be applied during scan shifting.

As described above in connection with FIG. 14, for each signal line a pair of probability values is determined. The first value is the probability that, on average, the signal line carries a logic value of 0. The second value is the probability that on average the signal line carries a logic value of 1. For signal lines that receive a pseudo primary input, the pair of probability values is determined as (0.5, 0.5). For each primary input in turn, the signal line that receives that primary input is assigned the logic value of 0, for example, $pi_1=0$. For all the other signal lines that receive primary input, the pair of probability values is determined as (0.5, 0.5). The probability values are propagated through the functional logic to determine the signal probability values throughout the functional logic. Then the transition rate $TR_{pi1=0}$ is calculated. The calculation is repeated with the primary input assigned the logic value of 1, in this example, $pi_1=1$, and the transition rate $TR_{pi1=1}$ is calculated. Analogous calculations are carried out for the other primary inputs. For each primary input $pi_i$, the value 1 at $pi_i$ is selected if $TR_{pii=1}$ is smaller than $TR_{pii=0}$; otherwise the value 0 is selected.

Figure 17:
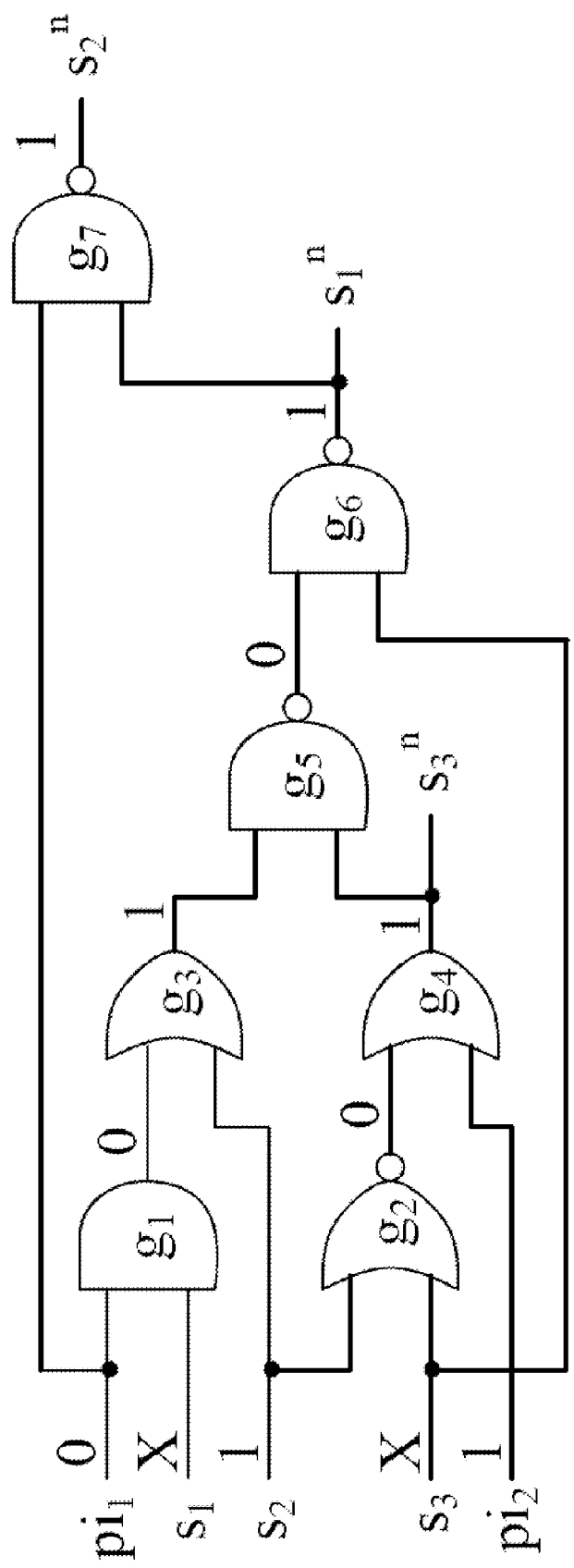
FIG. 17 shows the logic simulation results after applying an input control vector and a frozen value at a pseudo primary input.

For example, in FIG. 14 the toggling rates at $pi_1$ and $pi_2$ are $TR_{pi1=0}=2.112$, $TR_{pi1=1}=2.499$, $TR_{pi2=0}=2.378$, and $TR_{pi2=1}=2.237$. The set of primary inputs is selected to be $\{pi_1, pi_2\}=\{0, 1\}$. This set is the choice for primary inputs to reduce the toggling rates during scan shifting. If only one frozen scan cell is allowed, the method discussed above in connection with FIGS. 14-16 will freeze $s_2$ to value 1. The logic simulation results after applying the input control vector and the frozen value at $s_2$ are shown in FIG. 17. It can be seen that all internal signal lines have known values and there will be no toggling at internal signal lines during scan shifting. Clearly, a significant reduction in toggling rates has been made by careful choice of the primary input values.

In the second refinement of the methods disclosed herein, correlations among scan cells are taken into consideration when identifying power sensitive scan cells. It is recalled that the above-described algorithm to select power sensitive scan cells disregards correlations among scan cells. In fact, though, the toggling rate due to a particular scan cell will typically be changed after freezing a set of scan cells to constant values. An algorithm is described next that can maximize scan shift power reduction while satisfying the constraint of additional hardware limitation and taking the correlations among scan cells into consideration. The algorithm is a greedy algorithm in that it attempts to reach a globally optimum solution to the problem of freezing scan cells by making at each stage a locally optimum choice.

An example of pseudocode that describes the algorithm for identifying power sensitive scan cells is set forth in the following procedure called greedy_selection(f, K), where f is the percentage of scan cells to be frozen; the parameter K∈[1,M] is used to control computation complexity of the proposed algorithm; and M is equal to f % of the total number of scan cells. When K is equal to 1, the procedure is equivalent to the algorithm described above in connection with FIGS. 14-16. The larger the value of K that is used, the better the correlations among the scan cells are considered, and the longer the proposed procedure runs. The procedure uses forward and backward combinational logic cone tracing, as known in the art. It should be understood that the blocking components inserted at scan cell outputs can introduce additional delay. When the additional delay is not desirable to be introduced at the scan cells located in the timing critical paths, it is straightforward to integrate timing critical path constraints into the procedure greedy_selection (f; K) to skip selection of the scan cells to be frozen if the scan cells are located within the timing critical paths. To simplify the description of the example procedure greedy_selection(f, K), paths that are critical to proper signal timing are not taken into consideration.

The steps of the example procedure greedy_selection (f, K) are as follows:

1. Calculate a set of primary input values VPI to apply during scan shifting, as described above in connection with the first refinement.
2. Imply the set of primary input values VPI, so that the output value of the logic gates to which the primary inputs are applied can be determined.
3. Denote by F a set of scan cells selected to be frozen. Set the selected frozen scan cell set F to be empty.
4. Set M equal to f % of the total number of scan cells.
5. Set the number of frozen scan cells G selected in each iteration to be M/K.
6. Include all scan cells into a candidate list C.
7. While the cardinality of F is smaller than M, do the following:
   (a) For each scan cell in the candidate list C, calculate its TRR value as previously described. While calculating the signal probability, the probabilities of the PIs, scan cells, or internal signal lines with known values are assigned to be {P(0)=1, P(1)=0} if the known value is 0, and to be {P(0)=0, P(1)=1} if the known value is 1.
   (b) Sort the scan cells not in the set F according to the decreasing order of their TRR values.
   (c) Select the top G scan cells in the ordered list and add them to the set F.
   (d) Starting from each scan cell selected at Step 7(c), do forward combinational logic cone tracing, stopping the tracing at the scan cells and the internal gates with known values.
   (e) Starting from all the gates stopped at Step 7(d), do backward combinational logic cone tracing. The cone tracing stops at the scan cells and the internal gates with known values.
   (f) Set the candidate list C to first include all the scan cells not in the set F and then to exclude from C the scan cells not in the cone marked at Step 7(e). Since the TRR values of the excluded scan cells are not impacted by the frozen scan cells selected in the current iteration, it is unnecessary to calculate them again when selecting the next group of frozen scan cells.
   (g) Imply the frozen values at each of the scan cells selected at Step 7(c), so that the output value of the logic gates to which the frozen values are applied can be determined.
8. Return F.

The computational complexity of the example procedure greedy_selection( ) is O((M/K)×S×N), where S is the total number of scan cells in the circuit and N is the number of signal lines in the circuit. However, for real industrial designs, computational complexity is far less than O((M/K)×S×N) due to the speed-up steps 7(d) to 7(f), that is, the scan cells with the same TRR values as the previous iteration are identified in these steps. Hence the TRR values for those scan cells are not calculated again in the current iteration.

To further reduce the computational complexity in the procedure greedy_selection( ) calculation times of the TRR value for a scan cell are also shortened by restricting the number of internal signal lines to be updated as described earlier in the calculation of TRR. In a preferred implementation, the number of internal signal lines to be updated is set to be 5000.

Design Flow of Selecting Scan Cells to be Frozen During Scan Shifting

Figure 18:
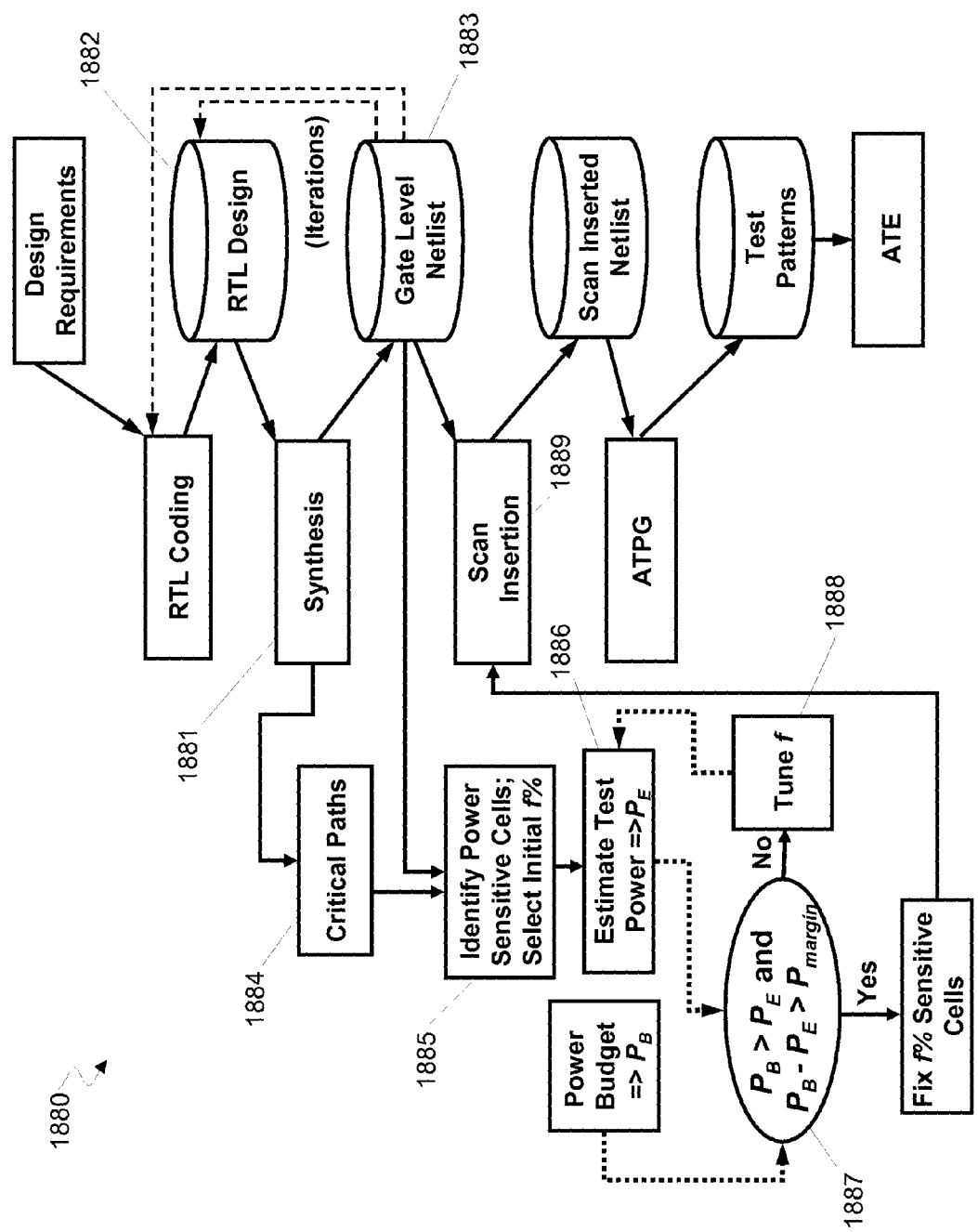
FIG. 18 illustrates a design flow that takes the scan shift power into consideration by using the disclosed method.

FIG. 18 illustrates a design flow 1880 that takes the scan shift power into consideration by using the disclosed method. After synthesizing 1881 a register transfer level (RTL) description 1882 to a gate level netlist 1883, all the critical paths in the design are extracted 1884. Then the proposed signal probability based algorithm is used to identify 1885 an ordered list of power sensitive sequential elements that will be scanned. To avoid the impact of the additional hardware on design performance, all sequential elements in the timing critical paths that should not be modified are excluded from the ordered list. User input to select top f % of power sensitive scan cells to be frozen is received, and a probabilistic analysis based power estimation tool is executed 1886 to estimate the test power PE under the assumption that the top f % power sensitive scan cells are frozen. Determination whether $P_B > P_E$ and $P_B - P_E > P_{margin}$, where $P_{margin}$ is a predefined power margin, is made 1887. If the power budget $P_B$ is less than $P_E$ or the difference between $P_B$ and $P_E$ is less than $P_{margin}$ 1888, f should be increased, for example, through user input, to select more power sensitive scan cells to be frozen. This step is repeated until the power budget is met. Similarly, when $P_B - P_E > P_{margin}$, f should be decreased to make the difference between $P_B$ and $P_E$ close to $P_{margin}$ in order to reduce the area overhead. After an appropriate f is found, insertion of scan chains with the top f % power sensitive scan cells frozen during scan shifting can be done.

The one-pass test synthesis flow shown in FIG. 18 assumes that a power estimation tool based on probabilistic analysis is run. In case of using simulation-based power estimation tools, ATPG patterns would have to be generated first and the test power would be calculated by simulating the ATPG patterns explicitly. If the test power is over the power budget, f should be increased, for example, through user input, to freeze more power sensitive scan cells in order to reduce the test power consumption. The above steps are repeated until the power budget is met. Adding more frozen scan cells iteratively after scan insertion will cause netlist change. To reduce the design cost, it is better to run ATPG before carrying out physical synthesis and use gate level netlist to estimate the test power consumed by the generated test patterns. Although the netlist has to be updated after adding more frozen scan cells, the test patterns generated before are still valid. To test newly added hardware, extra test patterns are generated. However, additional test generation efforts should be negligible due to a small number of additional logic gates to be considered by the test generator. Since the flow described above using simulation-based power estimation tools may change the netlist and may run ATPG iteratively, the one-pass test synthesis flow using the probabilistic power estimation tool is preferable from the point of view of design cost.

The above-described methods and circuits avoid higher power consumption of IC devices during scan testing by selectively blocking propagation of scan cell output transitions to functional logic of the IC device. In various implementations of the invention, selective blocking is applied to scan segments of the scan chains in the IC device. Blocking components in the scan segments are activated according to blocking data incorporated in test pattern data. In various other implementations of the invention, selective blocking is applied to the scan cells identified as causing the highest power consumption. Selective incorporation of blocking components in the IC device is based on statistical estimation of scan cell transition rates. The selected scan cells are frozen by enabling the associated blocking components, so that pre-selected signal values are presented to the functional logic of the IC device. At the same time, propagation of output value transitions that may take place in the scan cells, for example, during shifting in or shifting out of scan chain data, is prevented.

Figure 20:
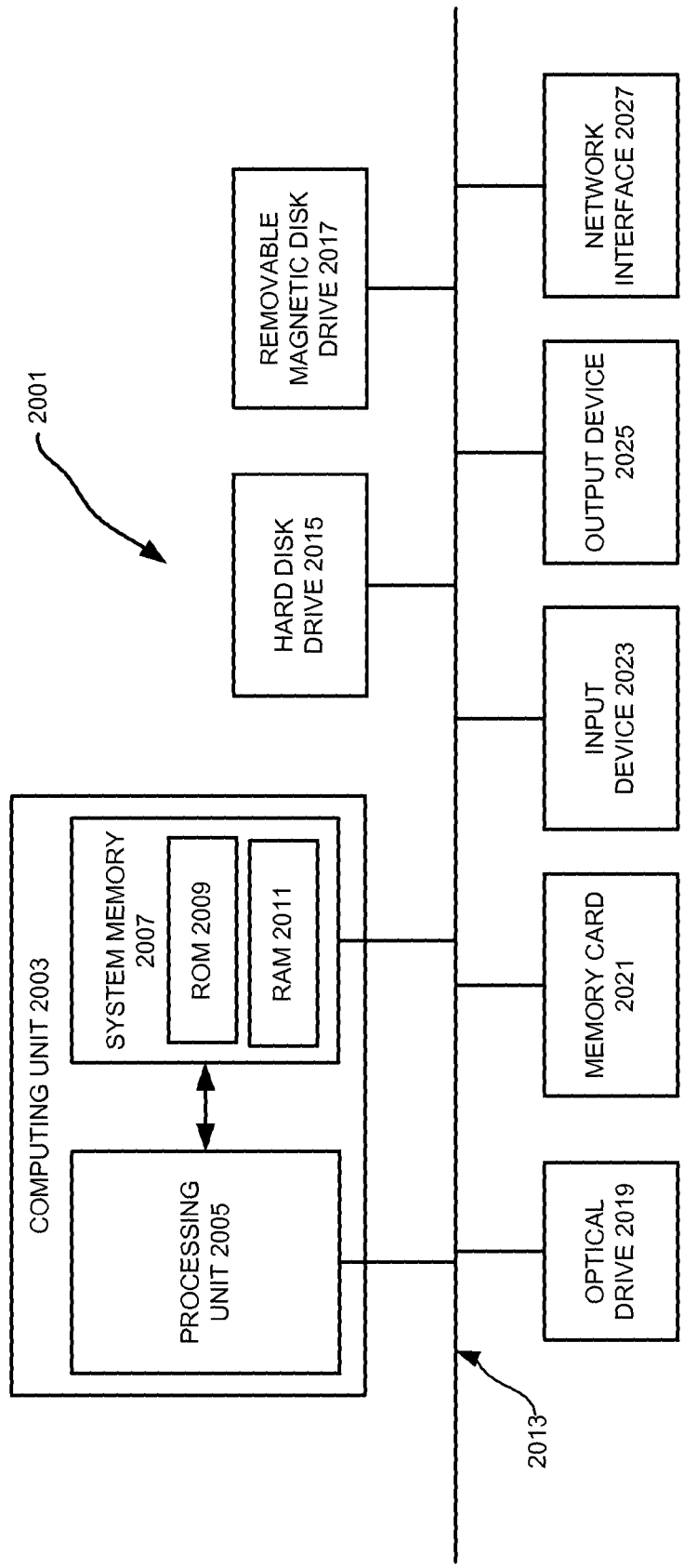
FIG. 20 illustrates a programmable computer system with which various embodiments of the invention may be employed.

Various examples of the invention may be implemented through the execution of software instructions by a computing device, such as a programmable computer. Accordingly, FIG. 20 shows an illustrative example of a computing device 2001. As seen in this figure, the computing device 2001 includes a computing unit 2003 with a processing unit 2005 and a system memory 2007. The processing unit 2005 may be any type of programmable electronic device for executing software instructions, but will conventionally be a microprocessor. The system memory 2007 may include both a read-only memory (ROM) 2009 and a random access memory (RAM) 2011. As will be appreciated by those of ordinary skill in the art, both the read-only memory (ROM) 2009 and the random access memory (RAM) 2011 may store software instructions for execution by the processing unit 2005.

The processing unit 2005 and the system memory 2007 are connected, either directly or indirectly, through a bus 2013 or alternate communication structure, to one or more peripheral devices. For example, the processing unit 2005 or the system memory 2007 may be directly or indirectly connected to one or more additional memory storage devices, such as a "hard" magnetic disk drive 2015, a removable magnetic disk drive 2017, an optical disk drive 2019, or a flash memory card 2021. The processing unit 2005 and the system memory 2007 also may be directly or indirectly connected to one or more input devices 2023 and one or more output devices 2025. The input devices 2023 may include, for example, a keyboard, a pointing device (such as a mouse, touchpad, stylus, trackball, or joystick), a scanner, a camera, and a microphone. The output devices 2025 may include, for example, a monitor display, a printer and speakers. With various examples of the computer 2001, one or more of the peripheral devices 2015-2025 may be internally housed with the computing unit 2003. Alternately, one or more of the peripheral devices 2015-2025 may be external to the housing for the computing unit 2003 and connected to the bus 2013 through, for example, a Universal Serial Bus (USB) connection.

With some implementations, the computing unit 2003 may be directly or indirectly connected to one or more network interfaces 2027 for communicating with other devices making up a network. The network interface 2027 translates data and control signals from the computing unit 2003 into network messages according to one or more communication protocols, such as the transmission control protocol (TCP) and the Internet protocol (IP). Also, the interface 2027 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 2001 is illustrated as an example only, and it not intended to be limiting. Various embodiments of the invention may be implemented using one or more computing devices that include the components of the computer 2001 illustrated in FIG. 20, which include only a subset of the components illustrated in FIG. 20, or which include an alternate combination of components, including components that are not shown in FIG. 20. For example, various embodiments of the invention may be implemented using a multi-processor computer, a plurality of single and/or multiprocessor computers arranged into a network, or some combination of both.

Various examples of the invention may also be implemented through by software instructions, stored on a non-transitory computer-readable medium, for instructing one or more programmable computers/computer systems to perform the disclosed methods. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, a "punched" surface type device, or a solid state storage device.

The above disclosure is provided to further explain in an enabling fashion the best modes of making and using various embodiments in accordance with the present invention. The disclosure is further offered to enhance an understanding and appreciation for the invention principles and advantages thereof, rather than to limit in any manner the invention. The invention is defined solely by the appended claims including any amendments of this application and all equivalents of those claims as issued.

It is further understood that the use of relational terms, if any, such as first and second, top and bottom, and the like are used solely to distinguish one from another entity or action without necessarily requiring or implying any actual such relationship or order between such entities or actions. Much of the inventive functionality and many of the inventive principles are best implemented with or in software programs or instructions and integrated circuits (ICs) such as application specific ICs. It is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation. Therefore, in the interest of brevity and minimization of any risk of obscuring the principles and concepts according to the present invention, further discussion of such software and ICs, if any, will be limited to the essentials with respect to the principles and concepts within the preferred embodiments.

This disclosure is intended to explain how to fashion and use various embodiments in accordance with the technology rather than to limit the true, intended, and fair scope and spirit thereof. The foregoing description is not intended to be exhaustive or to be limited to the precise forms disclosed. Modifications or variations are possible in light of the above teachings. The embodiment(s) was chosen and described to provide the best illustration of the principle of the described technology and its practical application, and to enable one of ordinary skill in the art to utilize the technology in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally and equitable entitled.

What is claimed is:

1. A method, executed by at least one processor of a computer, comprising:
   computing signal probability values for signal lines in a circuit design, wherein the signal lines comprise signal lines associated with scan cells in the circuit design;
   computing toggling probability values based on the signal probability values, wherein the toggling probability values comprise toggling rate values for the scan cells;
   computing toggling rate reduction values based on the toggling probability values, wherein the toggling rate reduction values comprise toggling rate reduction values for the scan cells;
   identifying scan cells having high toggling rate reduction values; and
   inserting logic configured to freeze parallel outputs of the identified scan cells during a scan shift process into the circuit design.

2. The method recited in claim 1, wherein the signal lines comprises signal lines associated with primary inputs of the circuit design.

3. The method recited in claim 1, wherein the computing signal probability values comprises:
   computing signal probability values when the signal probability values at parallel outputs of the scan cells are (0.5, 0.5);
   computing signal probability values when the signal probability values at parallel output of one scan cell are (1, 0) and the signal probability values at parallel outputs of the other scan cells are (0.5, 0.5); and
   computing signal probability values when the signal probability values at parallel output of the one scan cell are (0, 1) and the signal probability values at parallel outputs of the other scan cells are (0.5, 0.5).

4. The method recited in claim 1, wherein the identifying is based on a predetermined percentage value.

5. A non-transitory computer-readable medium storing computer-executable instructions for causing one or more processors to perform a method, the method comprising:
   computing signal probability values for signal lines in a circuit design, wherein the signal lines comprise signal lines associated with scan cells in the circuit design;
   computing toggling probability values based on the signal probability values, wherein the toggling probability values comprise toggling rate values for the scan cells;
   computing toggling rate reduction values based on the toggling probability values, wherein the toggling rate reduction values comprise toggling rate reduction values for the scan cells;
   identifying scan cells having high toggling rate reduction values; and
   inserting logic configured to freeze parallel outputs of the identified scan cells during a scan shift process into the circuit design.

6. The non-transitory computer-readable medium recited in claim 5, wherein the signal lines comprises signal lines associated with primary inputs of the circuit design.

7. The non-transitory computer-readable medium recited in claim 5, wherein the computing signal probability values comprises:
   computing signal probability values when the signal probability values at parallel outputs of the scan cells are (0.5, 0.5);
   computing signal probability values when the signal probability values at parallel output of one scan cell are (1, 0) and the signal probability values at parallel outputs of the other scan cells are (0.5, 0.5); and
   computing signal probability values when the signal probability values at parallel output of the one scan cell are (0, 1) and the signal probability values at parallel outputs of the other scan cells are (0.5, 0.5).

8. The non-transitory processor-readable medium recited in claim 5, wherein the identifying is based on a predetermined percentage value.

* * * * *